(12) United States Patent
Okamoto et al.

(10) Patent No.: US 9,929,736 B2
(45) Date of Patent: Mar. 27, 2018

(54) METHOD FOR DRIVING SEMICONDUCTOR DEVICE

(71) Applicant: Semiconductor Energy Laboratory Co., Ltd., Atsugi-shi, Kanagawa-ken (JP)

(72) Inventors: Yuki Okamoto, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/281,151

(22) Filed: Sep. 30, 2016

(65) Prior Publication Data

US 2017/0019117 A1    Jan. 19, 2017

Related U.S. Application Data

(63) Continuation of application No. 14/636,529, filed on Mar. 3, 2015, now Pat. No. 9,479,145.

(30) Foreign Application Priority Data

Mar. 7, 2014   (JP) ................ 2014-044522
Mar. 7, 2014   (JP) ................ 2014-044532

(Continued)

(51) Int. Cl.
*H03L 7/06*   (2006.01)
*H03L 7/099*  (2006.01)
(Continued)

(52) U.S. Cl.
CPC ........ *H03L 7/0995* (2013.01); *H01L 27/1225* (2013.01); *H01L 27/1255* (2013.01);
(Continued)

(58) Field of Classification Search
USPC .................... 327/147–149, 156–158
See application file for complete search history.

(56) References Cited

U.S. PATENT DOCUMENTS

| | | |
|---|---|---|
| 7,504,854 B1 | 3/2009 | Look et al. |
| 7,549,139 B1 | 6/2009 | Tuan et al. |

(Continued)

FOREIGN PATENT DOCUMENTS

| | | |
|---|---|---|
| JP | 10-242811 A | 9/1998 |
| JP | 2000-114934 A | 4/2000 |

OTHER PUBLICATIONS

Gao.X et al., "Jitter Analysis and a Benchmarking Figure-of-Merit for Phase-Locked Loops", IEEE Transactions on Circuits and Systems, Feb. 1, 2009, vol. 56, No. 2, pp. 117-121.

(Continued)

*Primary Examiner* — Adam Houston
(74) *Attorney, Agent, or Firm* — Fish & Richardson P.C.

(57) ABSTRACT

A novel PLL is provided. An oscillator circuit includes first to n-th inverters, and first and second circuits. A first terminal of each of the first and second circuits is electrically connected to an output terminal of the i-th inverter. A second terminal of each of the first and second circuits is electrically connected to an input terminal of the (i+1)-th inverter. The first circuit has functions of storing first data, switching between electrically disconnecting the first terminal and the second terminal from each other and setting a resistance between the first terminal and the second terminal to a value based on the first data. The second circuit has functions of storing second data, switching between electrically disconnecting the first terminal and the second terminal from each other and setting a resistance between the first terminal and the second terminal to a value based on the second data.

7 Claims, 27 Drawing Sheets

(30) Foreign Application Priority Data

Apr. 25, 2014 (JP) ................................ 2014-091047
Sep. 5, 2014 (JP) ................................ 2014-180900

(51) Int. Cl.
| | | |
|---|---|---|
| *H03K 3/356* | (2006.01) | |
| *H03K 17/0412* | (2006.01) | |
| *H03K 17/687* | (2006.01) | |
| *H01L 29/786* | (2006.01) | |
| *H03K 3/03* | (2006.01) | |
| *H03K 5/131* | (2014.01) | |
| *H01L 27/12* | (2006.01) | |
| *H03K 5/26* | (2006.01) | |
| *H03L 7/093* | (2006.01) | |

(52) U.S. Cl.
CPC .... *H01L 29/7869* (2013.01); *H01L 29/78693* (2013.01); *H03K 3/0315* (2013.01); *H03K 3/356086* (2013.01); *H03K 5/131* (2013.01); *H03K 5/26* (2013.01); *H03K 17/04123* (2013.01); *H03K 17/687* (2013.01); *H03L 7/093* (2013.01); *H03L 7/099* (2013.01)

(56) References Cited

U.S. PATENT DOCUMENTS

| | | | |
|---|---|---|---|
| 7,800,455 B2 | 9/2010 | Koyama et al. | |
| 8,729,938 B2 | 5/2014 | Watanabe | |
| 9,479,145 B2 | 10/2016 | Okamoto et al. | |
| 9,793,905 B2* | 10/2017 | Okamoto | H03L 7/099 |
| 2011/0114942 A1* | 5/2011 | Akimoto | H01L 29/45 |
| | | | 257/43 |
| 2011/0133796 A1* | 6/2011 | Osada | H03L 7/18 |
| | | | 327/156 |
| 2012/0293223 A1* | 11/2012 | Watanabe | H03L 3/00 |
| | | | 327/157 |
| 2014/0340073 A1* | 11/2014 | Okamoto | H03K 17/162 |
| | | | 324/76.39 |
| 2015/0221285 A1* | 8/2015 | Song | G09G 3/3208 |
| | | | 345/210 |
| 2015/0256161 A1* | 9/2015 | Okamoto | H03K 3/356086 |
| | | | 327/109 |
| 2016/0028347 A1* | 1/2016 | Okamoto | H03B 5/24 |
| | | | 331/108 R |
| 2016/0042787 A1 | 2/2016 | Brooks | |
| 2016/0043715 A1* | 2/2016 | Kurokawa | H03K 17/687 |
| | | | 365/189.011 |
| 2016/0117045 A1 | 4/2016 | Yamazaki et al. | |
| 2016/0126888 A1* | 5/2016 | Okamoto | H03L 7/099 |
| | | | 331/108 R |

OTHER PUBLICATIONS

Zhai.C et al., "An N-path Filter Enhanced Low Phase Noise Ring VCO", 2014 Symposium on VLSI Circuits Digest of Technical Papers, Jun. 10, 2014, pp. 187-188.

Anand.S et al., "A CMOS Clock Recovery Circuit for 2.5-Gb/s NRZ Data", IEEE Journal of Solid-State Circuits, Mar. 1, 2001, vol. 36, No. 3, pp. 432-439.

International Search Report (Application No. PCT/IB2015/051386) dated Apr. 28, 2015.

Written Opinion (Application No. PCT/IB2015/051386) dated Apr. 28, 2015.

* cited by examiner

METHOD FOR DRIVING SEMICONDUCTOR DEVICE

CROSS-REFERENCE TO RELATED APPLICATIONS

This application is a continuation of U.S. application Ser. No. 14/636,529, filed Mar. 3, 2015, now allowed, which claims the benefit of foreign priority applications filed in Japan as Serial No. 2014-044522 on Mar. 7, 2014, Serial No. 2014-044532 on Mar. 7, 2014, Serial No. 2014-091047 on Apr. 25, 2014, and Serial No. 2014-180900 on Sep. 5, 2014, all of which are incorporated by reference.

TECHNICAL FIELD

One embodiment of the present invention relates to a device such as a semiconductor device or a method for driving the device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

Phase-locked loops (PLLs) have been actively developed (see Non-Patent Document 1). The PLLs are used to operate a circuit, such as a CPU or a programmable logic device, at a desired operating speed.

REFERENCE

[Non-Patent Document 1] X. Gao, A. M. Klumperink, P. F. J. Geraedts, and B. Nauta, "Jitter Analysis and a Benchmarking Figure-of-Merit for Phase-Locked Loops," IEEE Trans. On Circuits and Systems—II, vol. 56, no. 2, pp. 117-121, February 2009

DISCLOSURE OF INVENTION

Conventional PLL circuits have difficulty changing oscillation frequencies instantly.

An object of one embodiment of the present invention is to provide a novel circuit configuration. Another object of one embodiment of the present invention is to change an oscillation frequency or to provide a circuit configuration capable of achieving the change.

Note that it is an object of one embodiment of the present invention to provide a novel semiconductor device or the like. Note that the descriptions of these objects do not disturb the existence of other objects. Note that in one embodiment of the present invention, there is no need to achieve all the objects. Other objects are apparent from and can be derived from the description of the specification, the drawings, the claims, and the like.

One embodiment of the present invention is a device including an oscillator circuit. The oscillator circuit includes first to n-th inverters (n is an odd number greater than or equal to 3), a first circuit, and a second circuit. A first terminal of the first circuit is electrically connected to an output terminal of the i-th inverter (i is a number from 1 to (n−1)). A second terminal of the first circuit is electrically connected to an input terminal of the (i+1)-th inverter. A first terminal of the second circuit is electrically connected to the output terminal of the i-th inverter. A second terminal of the second circuit is electrically connected to the input terminal of the (i+1)-th inverter. The first circuit has a function of storing first data. The first circuit has a function of switching between electrically disconnecting the first terminal and the second terminal from each other and setting a resistance between the first terminal and the second terminal to a value based on the first data. The second circuit has a function of storing second data. The second circuit has a function of switching between electrically disconnecting the first terminal and the second terminal from each other and setting a resistance between the first terminal and the second terminal to a value based on the second data.

In the above-described device, the first data and the second data may be analog potentials.

In the above-described device, the first circuit may include a first transistor and a first capacitor. The second circuit may include a second transistor and a second capacitor. The first data is input to the first capacitor through the first transistor. The second data is input to the second capacitor through the second transistor. The first transistor includes an oxide semiconductor in a channel formation region. The second transistor includes an oxide semiconductor in a channel formation region.

In the above-described device, the first circuit may include a third transistor and a fourth transistor. The second circuit may include a fifth transistor and a sixth transistor. The third transistor and the fourth transistor are electrically connected in series between the first terminal of the first circuit and the second terminal of the first circuit. The fifth transistor and the sixth transistor are electrically connected in series between the first terminal of the second circuit and the second terminal of the second circuit. A resistance between a source and a drain of the third transistor is based on the first data. The fourth transistor has a function of controlling electrical connection and disconnection between the first terminal of the first circuit and the second terminal of the first circuit. A resistance between a source and a drain of the fifth transistor is based on the first data. The sixth transistor has a function of controlling electrical connection and disconnection between the first terminal of the second circuit and the second terminal of the second circuit.

The above-described device may include a PLL. The PLL includes an oscillator circuit, a frequency divider, a phase comparator, and a loop filter.

One embodiment of the present invention is a method for driving a device including an oscillator circuit. The oscillator circuit includes first to n-th inverters (n is an odd number greater than or equal to 3), a first circuit, and a second circuit. A first terminal of the first circuit is electrically connected to an output terminal of the i-th inverter (i is a number from 1 to (n−1)). A second terminal of the first circuit is electrically connected to an input terminal of the (i+1)-th inverter. A first terminal of the second circuit is electrically connected to the output terminal of the i-th inverter. A second terminal of the second circuit is electrically connected to the input terminal of the (i+1)-th inverter. The oscillation frequency of the oscillator circuit is set to a first value by storing first data in the first circuit. The oscillation frequency of the oscillator circuit is set to a second value by storing second data in the second circuit. The oscillation frequency of the oscillator circuit is set to a value substantially equal to the first value by storing third data in the first circuit. The oscillation frequency of the oscillator circuit is set to a value substantially equal to the second value by storing fourth data in the second circuit. The third data has a value greater than that of the first data. The fourth data has a value greater than that of the second data.

In the above-described device, the first data, the second data, the third data, and the fourth data may be analog potentials.

In the above-described device, the first circuit may include a first transistor and a first capacitor. The second circuit may include a second transistor and a second capacitor. The first transistor includes an oxide semiconductor in a channel formation region. The second transistor includes an oxide semiconductor in a channel formation region. The first data or the third data is input to the first capacitor through the first transistor. The second data or the fourth data is input to the second capacitor through the second transistor.

In one embodiment of the present invention, a novel circuit configuration can be provided. In one embodiment of the present invention, an oscillation frequency can be changed, or a circuit configuration capable of achieving the change can be provided.

Note that the description of these effects does not disturb the existence of other effects. One embodiment of the present invention does not necessarily achieve all the above effects. Other effects will be apparent from and can be derived from the description of the specification, the drawings, the claims, and the like.

BEST MODE FOR CARRYING OUT THE INVENTION

Figure 1:
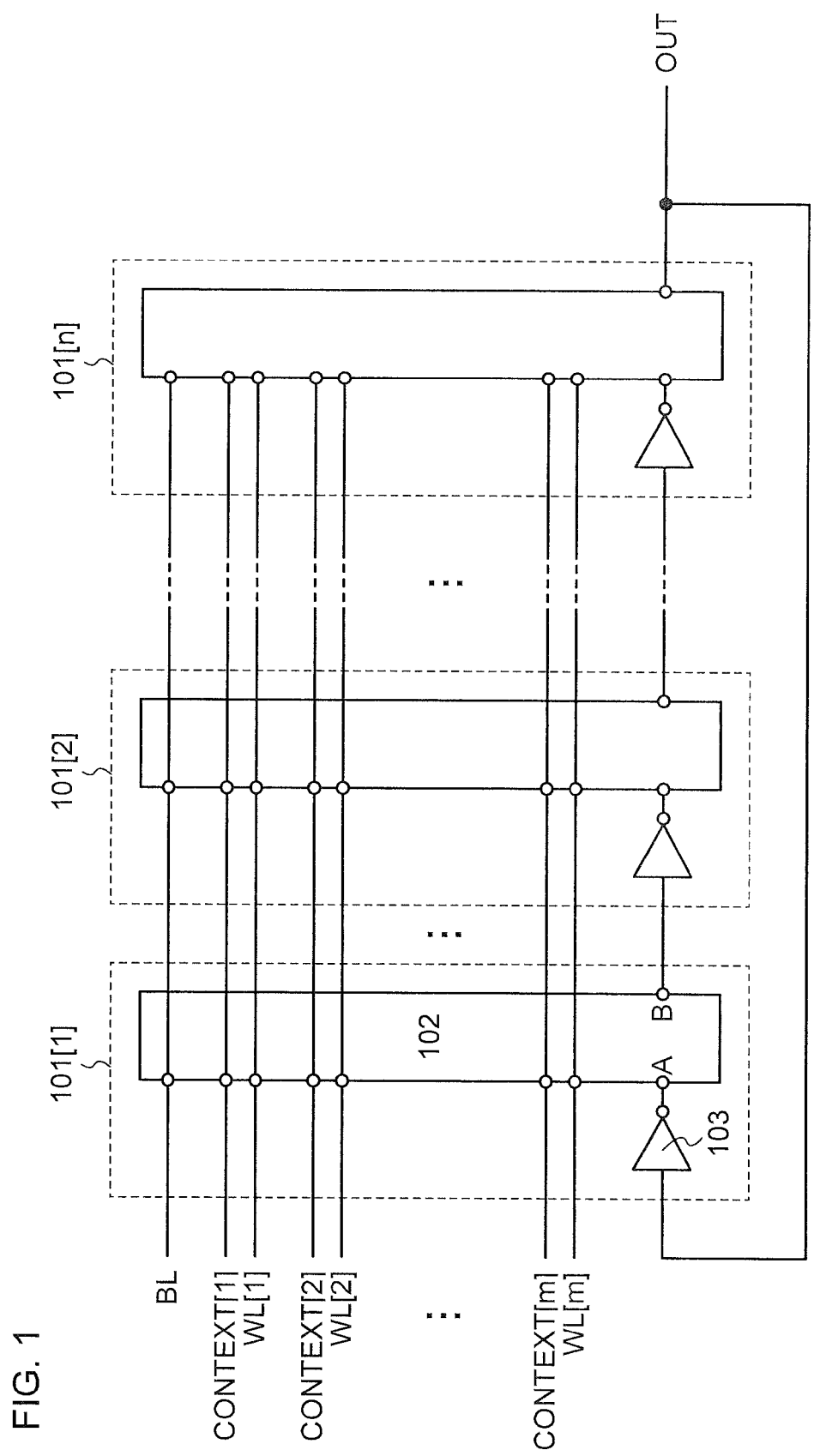
FIG. 1 illustrates a device configuration.

Embodiments of the present invention will be described in detail below with reference to drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

One embodiment of the present invention includes, in its category, any semiconductor device using transistors, for example, integrated circuits, RF tags, and semiconductor display devices. Note that the integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). In addition, the semiconductor display devices include, in its category, semiconductor display devices in which a circuit element including a semiconductor film is included in a driver circuit, such as liquid crystal display devices, light-emitting devices in which a light-emitting element typified by an organic light-emitting element (OLED) is provided for each pixel, electronic paper, digital micromirror devices (DMDs), plasma display panels (PDPs), and field emission displays (FEDs).

In this specification, the semiconductor display device includes, in its category, panels in which a display element such as a liquid crystal element or a light-emitting element is provided for each pixel, and modules in which an IC or the like including a controller is mounted on the panel.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y.

Note that an explicit description "X and Y are connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Note that a "source" of a transistor in this specification means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually, the names of the source and the drain interchange with each other depending on the relation of the potentials.

Embodiment 1

In this embodiment, a device according to one embodiment of the present invention will be described. In the case where a semiconductor element such as a transistor is used in the device according to one embodiment of the present invention, the device according to one embodiment of the present invention may be referred to as a semiconductor device.

FIG. 1 illustrates an example of a configuration of a device according to one embodiment of the present invention. The device illustrated in FIG. 1 has a function of generating an alternating-current signal such as a clock signal by oscillating, and may be referred to as an oscillator (or an oscillator circuit). Specifically, the device in FIG. 1 has a function of changing the frequency (or oscillation frequency) of a signal in accordance with input voltage, and may be referred to as a voltage-controlled oscillator (or a voltage-controlled oscillator circuit).

The device in FIG. 1 includes circuits 101[1] to 101[n] (n is an odd number greater than or equal to 3). The circuits 101[1] to 101[n] are connected in a ring configuration. Specifically, an output terminal of each of the circuits 101[1] to 101[n−1] is connected to an input terminal of the circuit of the subsequent stage. An output terminal of the circuit 101[n] is connected to an input terminal of the circuit 101[1]. The output terminal of the circuit 101[n] is connected to a terminal OUT. A signal generated by oscillation of the device in FIG. 1 is output from the terminal OUT.

Note that the signal generated by oscillation of the device in FIG. 1 may be output through a buffer or the like.

Each of the circuits 101[1] to 101[n] has a function of outputting an inverted signal of an input signal. In addition, each of the circuits 101[1] to 101[n] has a function of storing a plurality of sets of data and has a function of setting delay time according to the plurality of sets of data stored. The delay time refers to delay time of an output signal with respect to an input signal. Each of the circuits 101[1] to 101[n] can change delay time owing to its capability of storing a plurality of sets of data.

The device in FIG. 1 can change the oscillation frequency by changing the delay time of each of the circuits 101[1] to 101[n].

Each of the circuits 101[1] to 101[n] includes a circuit 102 and an inverter 103. A terminal A of the circuit 102 is connected to an output terminal of the inverter 103, and a terminal B of the circuit 102 is connected to an input terminal of the inverter 103 of the subsequent stage. That is, n inverters 103 are connected in a ring configuration, constituting an inverter ring. The circuit 102 is connected between one inverter 103 and another. The circuit 102 is also connected to a wiring BL, wirings CONTEXT[1] to CONTEXT[m] (m is a natural number greater than or equal to 2), and wirings WL[1] to WL[m].

Note that the circuit 102 may be connected between at least two of the n inverters 103.

The circuit 102 has a function of storing a plurality of sets of data and has a function of setting a resistance between the terminal A and the terminal B according to the plurality of sets of data stored. The circuit 102 can change the resistance between the terminal A and the terminal B owing to its capability of storing a plurality of sets of data.

The inverter 103 has a function of outputting an inverted signal of an input signal.

Note that instead of the inverter 103, a circuit having a function of outputting an inverted signal of an input signal may be employed. Examples of such a circuit include a NAND circuit, a NOR circuit, and the like.

The device in FIG. 1 can change the oscillation frequency by changing the resistance between the terminal A and the terminal B of the circuit 102 in each of the circuits 101[1] to 101[n]. Specifically, when the resistance between the terminal A and the terminal B of the circuit 102 changes, the load on the inverter 103 changes. Accordingly, the delay time of each of the circuits 101[1] to 101[n] changes; therefore, the oscillation frequency also changes.

A specific example of the circuit 102 will be described with reference to FIG. 2.

Figure 2:
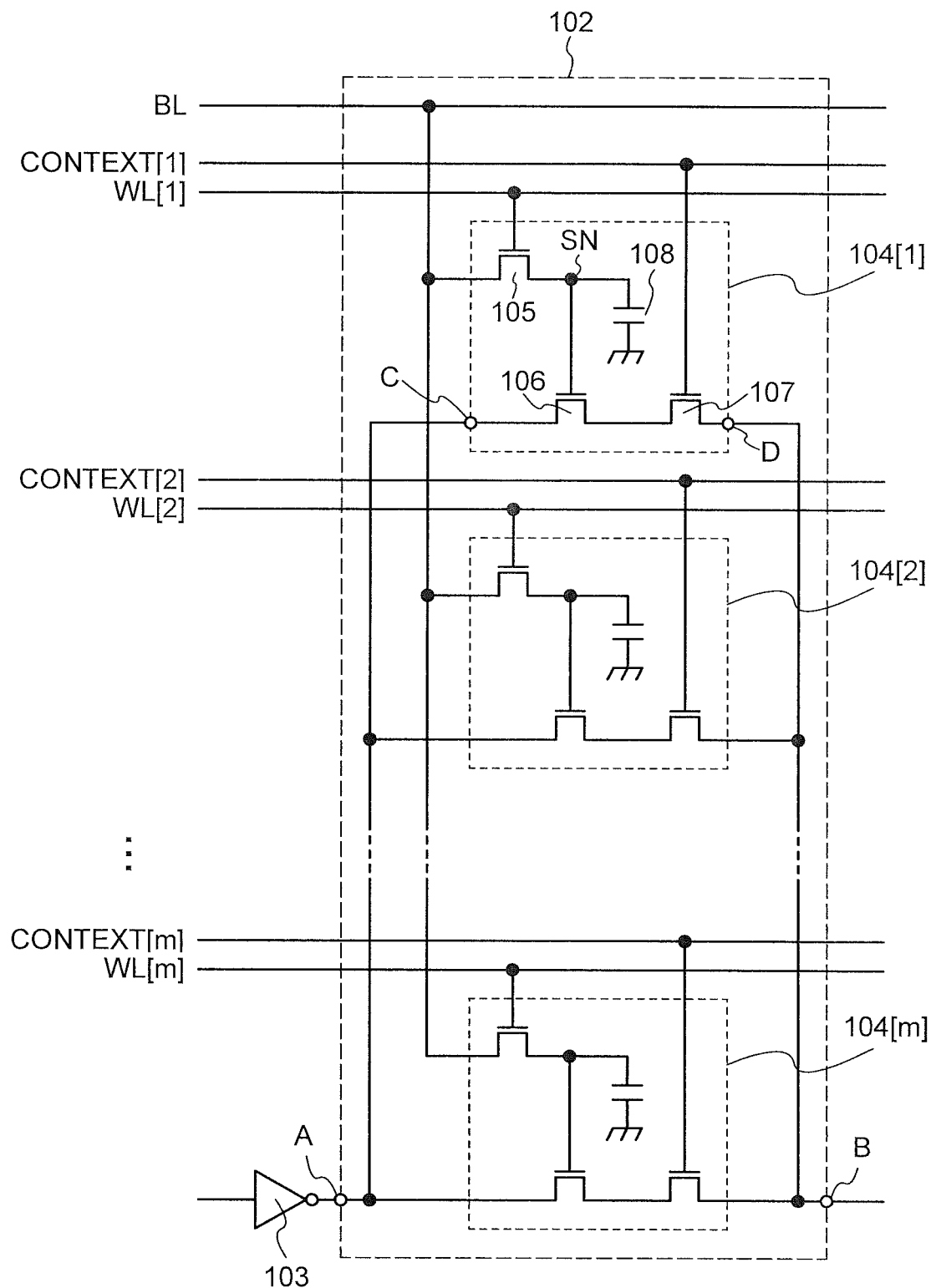
FIG. 2 illustrates a device configuration.

The circuit 102 illustrated in FIG. 2 includes circuits 104[1] to 104[m]. A terminal C of each of the circuits 104[1] to 104[m] is connected to the terminal A of the circuit 102, and a terminal D of each of the circuits 104[1] to 104[m] is connected to the terminal B of the circuit 102. Each of the circuits 104[1] to 104[m] is connected to the wiring BL, a corresponding one of the wirings CONTEXT[1] to CONTEXT[m], and a corresponding one of the wirings WL[1] to WL[m]. The corresponding one of the wirings WL[1] to WL[m] for the circuit 104[j] (j is a number from 1 to m) is the wiring WL[j]. The corresponding one of the wirings CONTEXT[1] to CONTEXT[m] for the circuit 104[j] is the wiring CONTEXT[j].

Each of the circuits 104[1] to 104[m] includes a transistor 105, a transistor 106, a transistor 107, and a capacitor 108. A first terminal of the transistor 105 is connected to the wiring BL, a second terminal of the transistor 105 is connected to a gate of the transistor 106, and a gate of the transistor 105 is connected to the corresponding one of the wirings WL[1] to WL[m]. A first terminal of the transistor 106 is connected to the terminal C. A first terminal of the transistor 107 is connected to a second terminal of the transistor 106, a second terminal of the transistor 107 is connected to the terminal D, and a gate of the transistor 107 is connected to the corresponding one of the wirings CONTEXT[1] to CONTEXT[m]. A first terminal of the capacitor 108 is connected to the gate of the transistor 106, and a second terminal of the capacitor 108 is connected to a wiring to which a predetermined potential is supplied.

Note that it is acceptable as long as the transistor 106 and the transistor 107 are connected in series between the terminal C and the terminal D, and the positions of the transistor 106 and the transistor 107 may be reversed.

The resistance between the terminal A and the terminal B of the circuit 102 is substantially equal to the combined resistance of resistances between the terminals C and the terminals D of the circuits 104[1] to 104[m]. Therefore, the resistance between the terminal A and the terminal B of the circuit 102 can be changed by controlling the resistances between the terminals C and the terminals D of the circuits 104[1] to 104[m].

Each of the circuits 104[1] to 104[m] has a function of storing a potential at a node SN and setting a resistance between a source and a drain of the transistor 106 in accordance with the potential. The potential can be stored at the node SN by turning on the transistor 105 so that the potential of the wiring BL is input to the node SN and charge based on the potential of the wiring BL is accumulated in the capacitor 108. Each of the circuits 104[1] to 104[m] can also store an analog potential at the node SN. Thus, the circuits 104[1] to 104[m] can store different potentials at the nodes SN and have different resistances between the sources and the drains of the transistors 106. In the case where the transistor 106 is an n-channel transistor, as the potential of the node SN increases, the resistance between the source and the drain of the transistor 106 decreases. In the case where the transistor 106 is a p-channel transistor, as the potential of the node SN decreases, the resistance between the source and the drain of the transistor 106 decreases.

As the transistor 105, a transistor including an oxide semiconductor in a channel formation region is preferably employed. As will be described later, the off-state current of the transistor including an oxide semiconductor in a channel formation region is small, and therefore, charge leakage from the capacitor 108 can be reduced. In the case where charge based on the analog potential is accumulated in the capacitor 108, the effect of employing the transistor including an oxide semiconductor in a channel formation region as the transistor 105 is particularly significant.

Note that the potential stored at the node SN is preferably a potential at which the transistor 106 is turned on. Thus, the resistance between the source and the drain of the transistor 106 can also be referred to as on-state resistance of the transistor 106.

Note that the capacitor 108 may be omitted in the case where charge based on the potential of the wiring BL can be accumulated as parasitic capacitance at the node SN such as gate capacitance of the transistor 106.

Each of the circuits 104[1] to 104[m] has a function of switching between electrically connecting the terminal C and the terminal D to each other and electrically disconnecting the terminal C and the terminal D from each other. Electrically connecting the terminal C and the terminal D to each other and electrically disconnecting the terminal C and the terminal D from each other can be switched by turning on or off the transistor 107. When the transistor 107 is on, the terminal C and the terminal D are electrically connected to each other, and thus, the resistance between the terminal C and the terminal D depends on the resistance between the source and the drain of the transistor 106. Specifically, the resistance between the terminal C and the terminal D is substantially equal to the sum of the resistance between the source and the drain of the transistor 106 and the resistance between the source and the drain of the transistor 107 in an on state. On the other hand, when the transistor 107 is off, the terminal C and the terminal D are electrically disconnected from each other, and thus, the terminal C and the terminal D have high impedance regardless of the resistance between the source and the drain of the transistor 106.

Each of the circuits 104[1] to 104[m] has a function of switching between electrically disconnecting the terminal C and the terminal D from each other and setting the resistance between the terminal C and the terminal D to a value based on stored data.

The resistance between the terminal A and the terminal B of the circuit 102 can be changed by a variety of methods.

The resistance between the terminal A and the terminal B of the circuit 102 can be changed by selecting one or more circuits in each of which the terminal C and the terminal D are to be electrically connected to each other from the circuits 104[1] to 104[m] and controlling the number thereof. In the case where the circuits 104[1] to 104[m] store the same data, the circuits 104[1] to 104[m] have the same resistance between the sources and the drains of the transistors 106. Therefore, the resistance between the terminal A and the terminal B of the circuit 102 can be controlled by controlling the number of circuits in each of which the terminal C and the terminal D are electrically connected to each other among the circuits 104[1] to 104[m].

The resistance between the terminal A and the terminal B of the circuit 102 can be changed in accordance with data stored in a circuit in which the terminal C and the terminal D are to be electrically connected to each other, which is selected from the circuits 104[1] to 104[m]. In the case where the circuits 104[1] to 104[m] store different data, the circuits 104[1] to 104[m] have different resistances between the sources and the drains of the transistors 106. Therefore, the resistance between the terminal A and the terminal B of the circuit 102 can be controlled by which of the circuits 104[1] to 104[m] is selected.

Note that the two aforementioned examples may be combined as appropriate. That is, different data may be stored in at least two of the circuits 104[1] to 104[m], and the resistance between the terminal A and the terminal B of the circuit 102 may be changed by selecting one or more circuits in each of which the terminal C and the terminal D are to be electrically connected to each other from the circuits 104[1] to 104[m].

Note that as the proportion of the resistance of the transistor 106 in the resistance between the terminal A and the terminal B increases, the amount of change in oscillation frequency with respect to the resistance between the source and the drain of the transistor 106 increases. Thus, the ratio of channel width (W) to channel length (L) of the transistor 106 (W/L) is preferably lower than the W/L of the transistor 107. In other words, the W/L of the transistor 107 is preferably higher than the W/L of the transistor 106. Alternatively, the W/L of the transistor 106 is preferably lower than the W/L of one of or all transistors included in the inverter 103 or in a circuit which can be employed instead of the inverter 103. In other words, the W/L of one of or all transistors included in the inverter 103 or in a circuit which can be employed instead of the inverter 103 is preferably higher than the W/L of the transistor 106.

Note that as described above, a NAND circuit, a NOR circuit, or the like may be employed instead of the inverter 103. An output terminal of the NAND circuit or the NOR circuit corresponds to the output terminal of the inverter 103, and a first input terminal of the NAND circuit or the NOR circuit corresponds to the input terminal of the inverter 103. That is, the output terminal of the NAND circuit or the NOR circuit is connected to the terminal A of the circuit 102, and the input terminal of the NAND circuit or the NOR circuit is connected to the terminal B of the circuit 102 of the previous stage. In the circuits 101[1] to 101[n], second input terminals of the respective NAND circuits or NOR circuits are preferably connected to the same wiring. Then, the potential of the terminal A of the circuit 102 can be fixed by controlling the potential of a wiring to which the second input terminal of the NAND circuit or the NOR circuit is connected. Accordingly, the potential of the wiring BL can be input to the gate of the transistor 106 in the state where the potential of the first terminal of the transistor 106 is fixed, and therefore, the potential difference between the gate and the source of the transistor 106 can be accurately set. Consequently, the resistance between the source and the drain of the transistor 106 can be accurately set.

Figure 27:
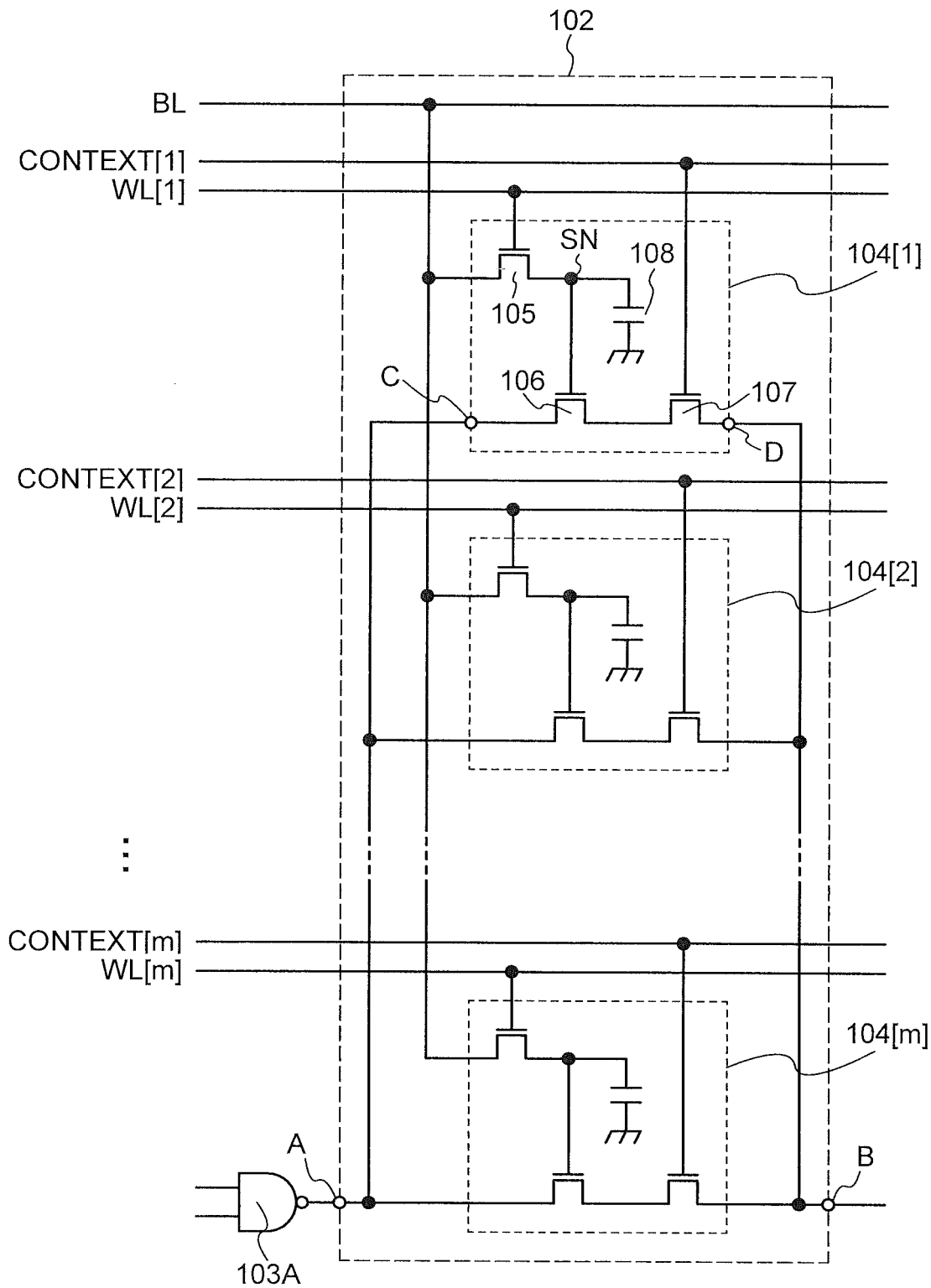
FIG. 27 illustrates a device configuration.

Note that FIG. 27 illustrates an example in which a NAND circuit 103A is employed instead of the inverter 103. An output terminal of the NAND circuit 103A corresponds to the output terminal of the inverter 103 and is connected to the terminal A. A first input terminal of the NAND circuit 103A corresponds to the input terminal of the inverter 103 and is connected to the terminal B of the circuit 102 of the previous stage. A second input terminal of the NAND circuit 103A is connected to a wiring which is not illustrated. It is preferable that the second input terminals of the NAND circuits 103A in the circuits 101[1] to 101[n] be connected to the same wiring.

Figure 3:
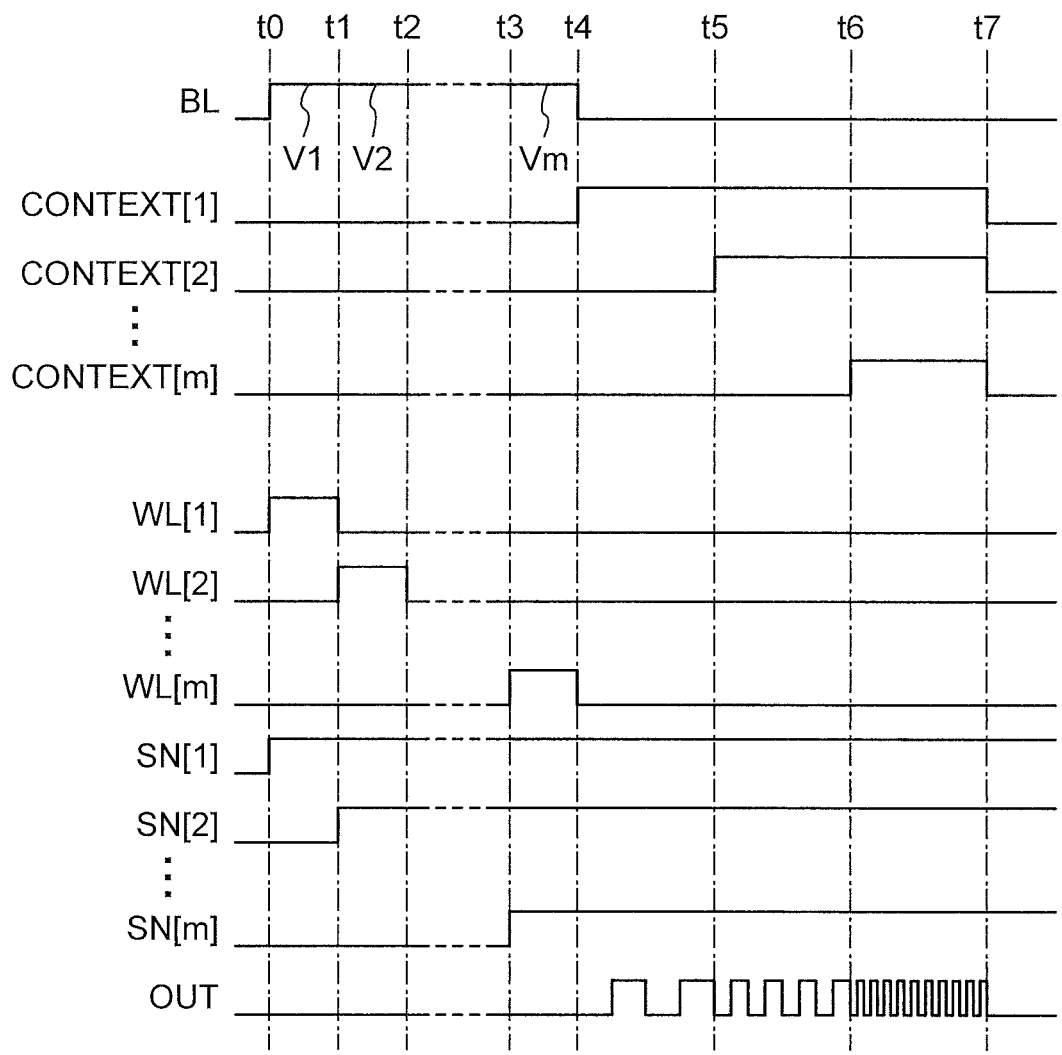
FIG. 3 illustrates a device operation.

Next, an operation example of the device illustrated in FIG. 1 will be described with reference to a timing chart in FIG. 3. FIG. 3 shows examples of potentials of the wiring BL, the wirings CONTEXT[1] to CONTEXT[m], the wirings WL[1] to WL[m], the nodes SN of the circuits 104[1] to 104[m], and the output terminal OUT.

Note that the circuits 101[1] to 101[n] operate in the same manner, thus, the operation of only one of the circuits 101[1] to 101[n] is described here.

First, data is stored in each of the circuits 104[1] to 104[m], and the resistance between the source and the drain of the transistor 106 is set in accordance with the data.

At time t0, the wiring WL[1] is set at a high level, and the wiring BL is set at a potential V1. Thus, the circuit 104[1] operates as follows. Since the transistor 105 is turned on, the potential V1 of the wiring BL is input to the node SN through the transistor 105, and charge based on the potential V1 is accumulated in the capacitor 108. After that, the wiring WL[1] is set at a low level, and the transistor 105 is thus turned off. Therefore, the node SN is kept at the potential V1 owing to charge accumulated in the capacitor 108. In this manner, data based on the potential V1 is stored in the circuit 104[1].

At time t1, the wiring WL[2] is set at the high level, and the wiring BL is set at a potential V2. Thus, the circuit 104[2] operates as follows. Since the transistor 105 is turned on, the potential V2 of the wiring BL is input to the node SN through the transistor 105, and charge based on the potential V2 is accumulated in the capacitor 108. After that, the wiring WL[2] is set at the low level, and the transistor 105 is thus turned off. Therefore, the node SN is kept at the potential V2 owing to charge accumulated in the capacitor 108. In this manner, data based on the potential V2 is stored in the circuit 104[2].

After time t2, the wirings WL[3] to WL[m−1] are sequentially set at the high level and accordingly the potential of the wiring BL is set as appropriate, whereby data based on the potential of the wiring BL is stored in each of the circuits 104[3] to 104[m−1].

At time t3, the wiring WL[m] is set at the high level, and the wiring BL is set at a potential Vm. Thus, the circuit 104[m] operates as follows. Since the transistor 105 is turned on, the potential Vm of the wiring BL is input to the node SN through the transistor 105, and charge based on the potential Vm is accumulated in the capacitor 108. After that, the wiring WL[m] is set at the low level, and the transistor 105 is thus turned off. Therefore, the node SN is kept at the potential Vm owing to charge accumulated in the capacitor 108. In this manner, data based on the potential Vm is stored in the circuit 104[*m*].

As described above, data based on the potential of the wiring BL can be sequentially stored in the circuits 104[1] to 104[*m*] by sequentially setting the wirings WL[1] to WL[m] at the high level and setting the potential of the wiring BL as appropriate.

Note that in a period from time t0 to time t4, the wirings CONTEXT[1] to CONTEXT[m] may be set at a high level or a low level. That is, in each of the circuits 104[1] to 104[*m*], the transistor 107 may be on or off. FIG. 3 illustrates an example in which in the period from time t0 to time t4, the wirings CONTEXT[1] to CONTEXT[m] are set at the low level, whereby the transistor 107 in each of the circuits 104[1] to 104[*m*] is turned off. Therefore, the terminal C and the terminal D in each of the circuits 104[1] to 104[*m*] are electrically disconnected from each other, and thus, the terminal A and the terminal B of the circuit 102 have high impedance. Accordingly, the device illustrated in FIG. 1 does not oscillate in the period from time t0 to time t4. In each of the circuits 104[1] to 104[*m*], the terminal B is brought into a floating state by turning off the transistor 107. Therefore, the potential of the terminal B gradually becomes a predetermined potential such as a ground potential. For example, in the case where the potential of the wiring B corresponds to the low level, an output of the inverter 103 of the subsequent stage is at the high level. That is, the potential of the terminal A can be fixed. Accordingly, the potential of the wiring BL can be input to the gate of the transistor 106 in the state where the potential of the first terminal of the transistor 106 is fixed, and therefore, the potential difference between the gate and the source of the transistor 106 can be accurately set. Consequently, the resistance between the source and the drain of the transistor 106 can be accurately set.

Note that FIG. 3 illustrates an example in which the potentials V1 to Vm have the same value. However, the present invention is not limited to this example.

Note that the potential of the wiring BL which is stored in the circuit 104[*j*] is referred to as a potential Vj.

Note that FIG. 3 illustrates an example in which the wirings WL[1] to WL[m] are sequentially set at the high level; however, the present invention is not limited to this example. The wirings WL[1] to WL[m] may be set at the high level in a given order. Two or more of the wirings WL[1] to WL[m] may be set at the high level at the same time. Not all the wirings WL[1] to WL[m] are necessarily set at the high level. Furthermore, the aforementioned matters may be combined.

Note that FIG. 3 illustrates an example in which the transistors 105 are turned on by setting the wirings WL[1] to WL[m] at the high level; however, the present invention is not limited thereto. The transistors 105 may be turned on by setting the wirings WL[1] to WL[m] at the low level. The potential of the wirings WL[1] to WL[m] at which the transistors 105 are turned on may be referred to as an active potential, and the potential of the wirings WL[1] to WL[m] at which the transistors 105 are turned off may be referred to as a non-active (or inactive) potential. Similarly, the potential of the wirings CONTEXT[1] to CONTEXT[m] at which the transistors 107 are turned on may be referred to as an active potential, and the potential of the wirings CONTEXT[1] to CONTEXT[m] at which the transistors 107 are turned off may be referred to as a non-active potential.

Next, the resistance between the terminal A and the terminal B of the circuit 102 is changed by controlling whether the terminal C and the terminal D are electrically connected to each other or disconnected from each other in each of the circuits 104[1] to 104[*m*]. In addition, the frequency of a signal of the terminal OUT is changed in accordance with the resistance between the terminal A and the terminal B of the circuit 102.

At time t4, the wiring CONTEXT[1] is set at a high level, and the wirings CONTEXT[1] to CONTEXT[m] are set at a low level. Accordingly, the transistor 107 in the circuit 104[1] is turned on, and thus, the resistance between the terminal C and the terminal D becomes a value based on the resistance between the source and the drain of the transistor 106. That is, the resistance between the terminal C and the terminal D of the circuit 104[1] becomes a value based on the stored data. Each of the transistors 107 in the circuits 104[2] to 104[*m*] is turned off, and thus, the terminal C and the terminal D are electrically disconnected from each other. Therefore, the frequency of the signal of the terminal OUT is determined on the basis of the data stored in the circuit 104[1].

At time t5, the wirings CONTEXT[1] and CONTEXT[2] are set at the high level, and the wirings CONTEXT[1] to CONTEXT[m] are set at the low level. Accordingly, the transistor 107 in each of the circuits 104[1] and 104[2] is turned on, and thus, the resistance between the terminal C and the terminal D becomes a value based on the resistance between the source and the drain of the transistor 106. That is, the resistance between the terminal C and the terminal D of each of the circuits 104[1] and 104[2] becomes a value based on the stored data. The transistor 107 in each of the circuits 104[3] to 104[*m*] is turned off, and thus, the terminal C and the terminal D are electrically disconnected from each other. Therefore, the frequency of the signal of the terminal OUT is determined on the basis of the data stored in the circuits 104[1] and 104[2].

At time t5, the terminal C and the terminal D are electrically connected to each other in each of two of the circuits 104[1] to 104[*m*], whereas at time t4, the terminal C and the terminal D are electrically connected to each other in one of the circuits 104[1] to 104[*m*]. Thus, the resistance between the terminal A and the terminal B of the circuit 102 set at time t5 is lower than the resistance between the terminal A and the terminal B of the circuit 102 set at time t4. Therefore, the frequency of the signal of the terminal OUT determined at time t5 is higher than the frequency of the signal of the terminal OUT determined at time t4.

At time t6, the wirings CONTEXT[1] to CONTEXT[m] are set at the high level. Accordingly, the transistor 107 in each of the circuits 104[1] to 104[*m*] is turned on, and thus, the resistance between the terminal C and the terminal D becomes a value based on the resistance between the source and the drain of the transistor 106. That is, the resistance between the terminal C and the terminal D of each of the circuits 104[1] to 104[*m*] becomes a value based on the stored data. Therefore, the frequency of the signal of the terminal OUT is determined on the basis of the data stored in the circuits 104[1] to 104[*m*].

At time t6, the terminal C and the terminal D are electrically connected to each other in each of the circuits 104[1] to 104[*m*], whereas at time t4, the terminal C and the terminal D are electrically connected to each other in one of the circuits 104[1] to 104[*m*], and at time t5, the terminal C and the terminal D are electrically connected to each other in each of two of the circuits 104[1] to 104[*m*]. Thus, the resistance between the terminal A and the terminal B of the circuit 102 set at time t6 is lower than the resistance between the terminal A and the terminal B of the circuit 102 set at each of times t4 and t5. Therefore, the frequency of the signal of the terminal OUT determined at time t6 is higher than the frequency of the signal of the terminal OUT determined at each of times t4 and t5.

As described above, the frequency of the signal of the terminal OUT can be changed on the basis of the number of circuits in each of which the terminal C and the terminal D are electrically connected to each other, among the circuits 104[1] to 104[*m*].

Note that FIG. 3 illustrates an example in which the potentials V1 to V*m* of the wiring BL have the same value, i.e., an example in which the same data is stored in each of the circuits 104[1] to 104[*m*]; however, the present invention is not limited to this example. For example, the potentials V1 to V*m* of the wiring BL may have different values. That is, the circuits 104[1] to 104[*m*] may store different data. Alternatively, at least two of the potentials V1 to V*m* of the wiring BL may have different values. That is, at least two of the circuits 104[1] to 104[*m*] may store different data.

Figure 4:
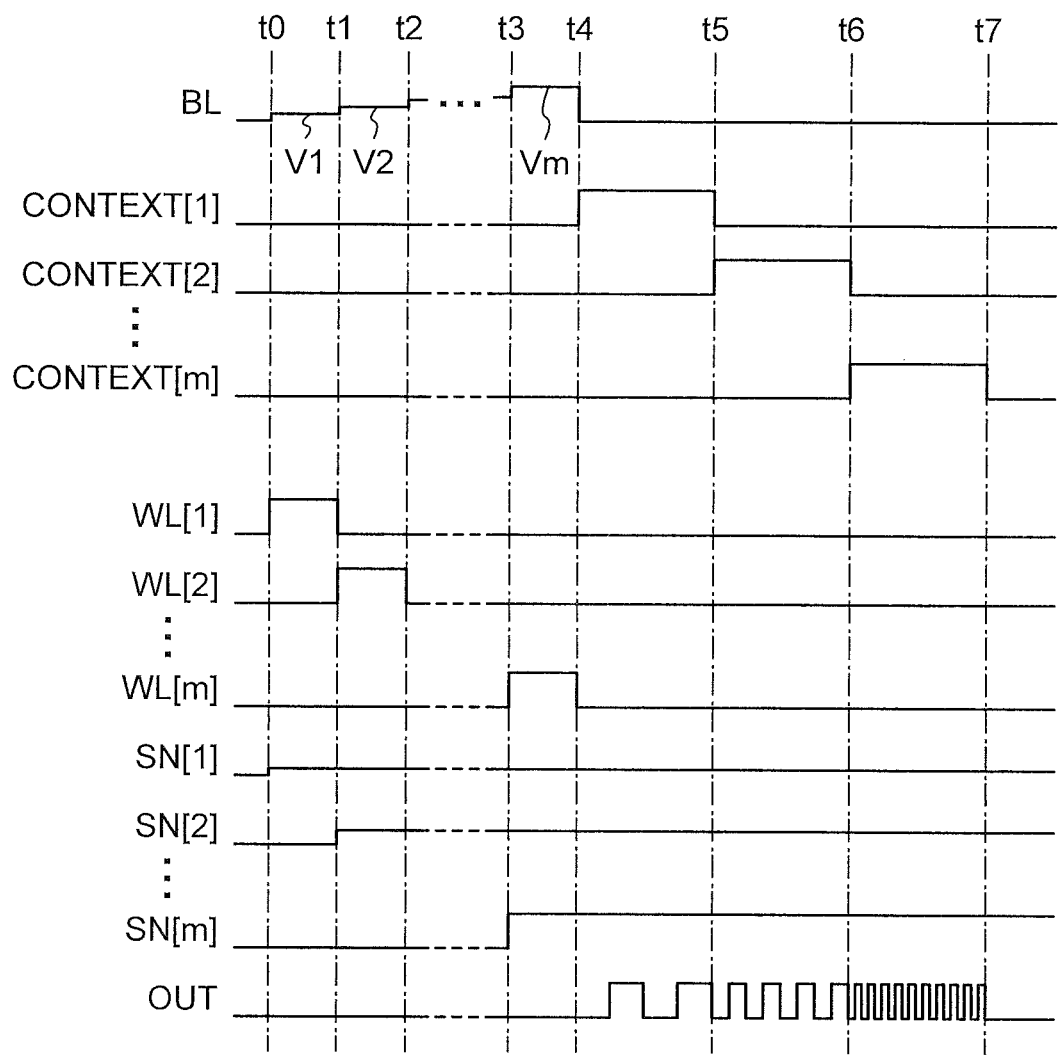
FIG. 4 illustrates a device operation.

FIG. 4 illustrates an example in which the potential of the wiring BL becomes higher every time the wirings WL[1] to WL[m] are set at the high level. As to the potentials V1 to V*m*, it is satisfied that a potential Vj is higher than a potential Vj−1 and lower than a potential Vj+1; for example, the potential V2 is higher than the potential V1 and the potential V*m* is higher than, the potential V*m*−1.

FIG. 4 illustrates an example in which the wiring CONTEXT[1] is set at the high level at time t4, the wiring CONTEXT[2] is set at the high level at time t5, and the wiring CONTEXT[m] is set at the high level at time t6. That is, the frequency of the signal of the terminal OUT is determined at time t4 on the basis of the data stored in the circuit 104[1], is determined at time t5 on the basis of the data stored in the circuit 104[2], and is determined at time t6 on the basis of the data stored in the circuit 104[*m*].

Since the potential V2 is higher than the potential V1, the resistance between the source and the drain of the transistor 106 in the circuit 104[2] is lower than the resistance between the source and the drain of the transistor 106 in the circuit 104[1]. Thus, the resistance between the terminal A and the terminal B of the circuit 102 set at time t5 is lower than the resistance between the terminal A and the terminal B of the circuit 102 set at time t4. Therefore, the frequency of the signal of the terminal OUT determined at time t5 is higher than the frequency of the signal of the terminal OUT determined at time t4.

Since the potential V*m* is higher than each of the potentials V1 and V2, the resistance between the source and the drain of the transistor 106 in the circuit 104[*m*] is lower than the resistance between the source and the drain of the transistor 106 in each of the circuits 104[1] and 104[2]. Thus, the resistance between the terminal A and the terminal B of the circuit 102 set at time t6 is lower than the resistance between the terminal A and the terminal B of the circuit 102 set at each of times t4 and t5. Therefore, the frequency of the signal of the terminal OUT determined at time t6 is higher than the frequency of the signal of the terminal OUT determined at each of times t4 and t5.

As described above, the frequency of the signal of the terminal OUT can be changed on the basis of data stored in a circuit in which the terminal C and the terminal D are electrically connected to each other, among the circuits 104[1] to 104[*m*].

Figure 5:
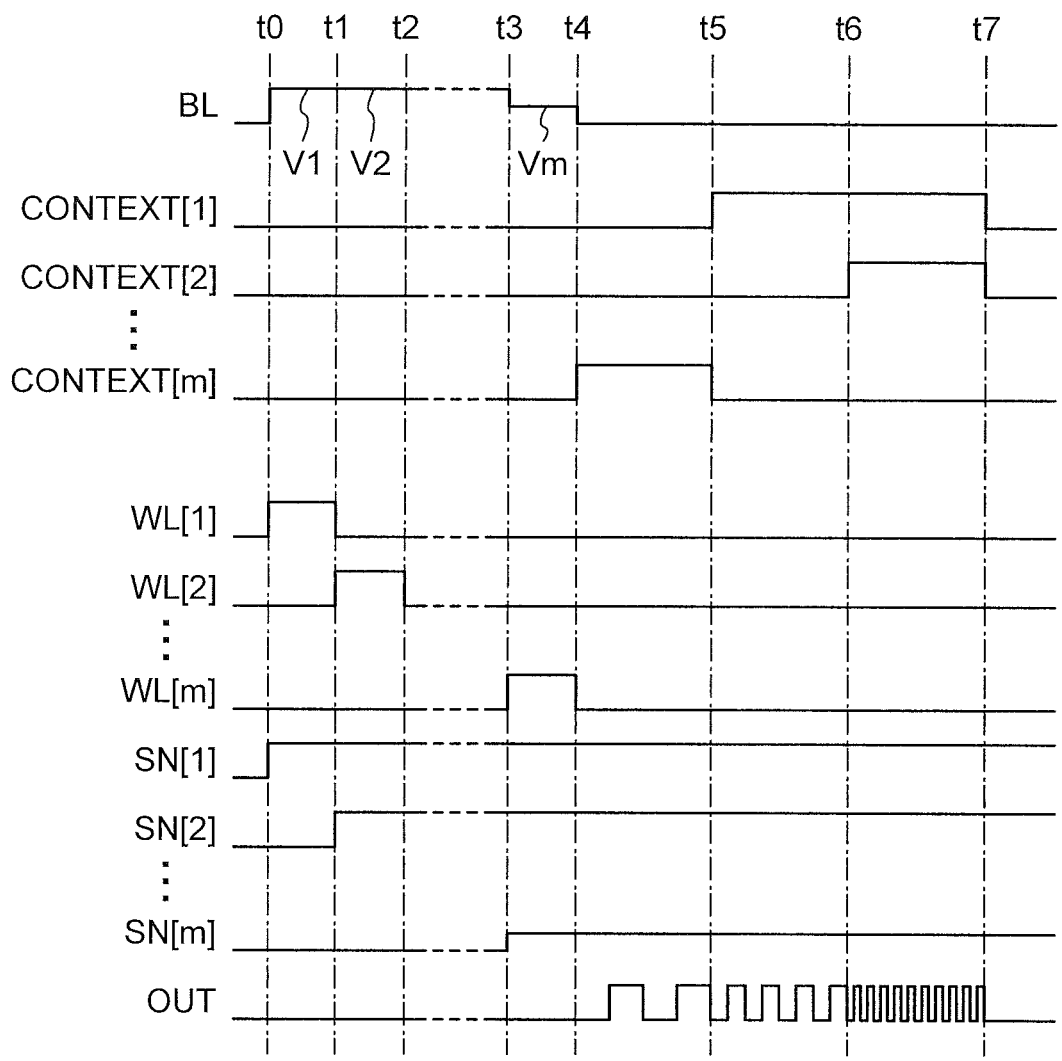
FIG. 5 illustrates a device operation.

FIG. 5 illustrates an example in which the potentials V1 to V*m*−1 have the same value and the potential V*m* is lower than each of the potentials V1 to V*m*−1.

FIG. 5 illustrates an example in which the wiring CONTEXT[m] is set at the high level at time t4, the wiring CONTEXT[1] is set at the high level at time t5, and the wirings CONTEXT[1] and CONTEXT[1] are set at the high level at time t6. That is, the frequency of the signal of the terminal OUT is determined at time t4 on the basis of the data stored in the circuit 104[*m*], is determined at time t5 on the basis of the data stored in the circuit 104[1], and is determined at time t6 on the basis of the data stored in the circuits 104[1] and 104[2].

Since the potential V1 is higher than the potential V*m*, the resistance between the source and the drain of the transistor 106 in the circuit 104[1] is lower than the resistance between the source and the drain of the transistor 106 in the circuit 104[*m*]. Thus, the resistance between the terminal A and the terminal B of the circuit 102 set at time t5 is lower than the resistance between the terminal A and the terminal B of the circuit 102 set at time t4. Therefore, the frequency of the signal of the terminal OUT determined at time t5 is higher than the frequency of the signal of the terminal OUT determined at time t4.

At time t6, the terminal C and the terminal D are electrically connected to each other in each of the circuits 104[1] and 104[2], whereas at time t5, the terminal C and the terminal D are electrically connected to each other in the circuit 104[1]. Thus, the resistance between the terminal A and the terminal B of the circuit 102 set at time t6 is lower than the resistance between the terminal A and the terminal B of the circuit 102 set at time t5. Therefore, the frequency of the signal of the terminal OUT determined at time t6 is higher than the frequency of the signal of the terminal OUT determined at time t5.

As described above, the operations illustrated in FIGS. 3 and 4 may be combined.

Figure 6:
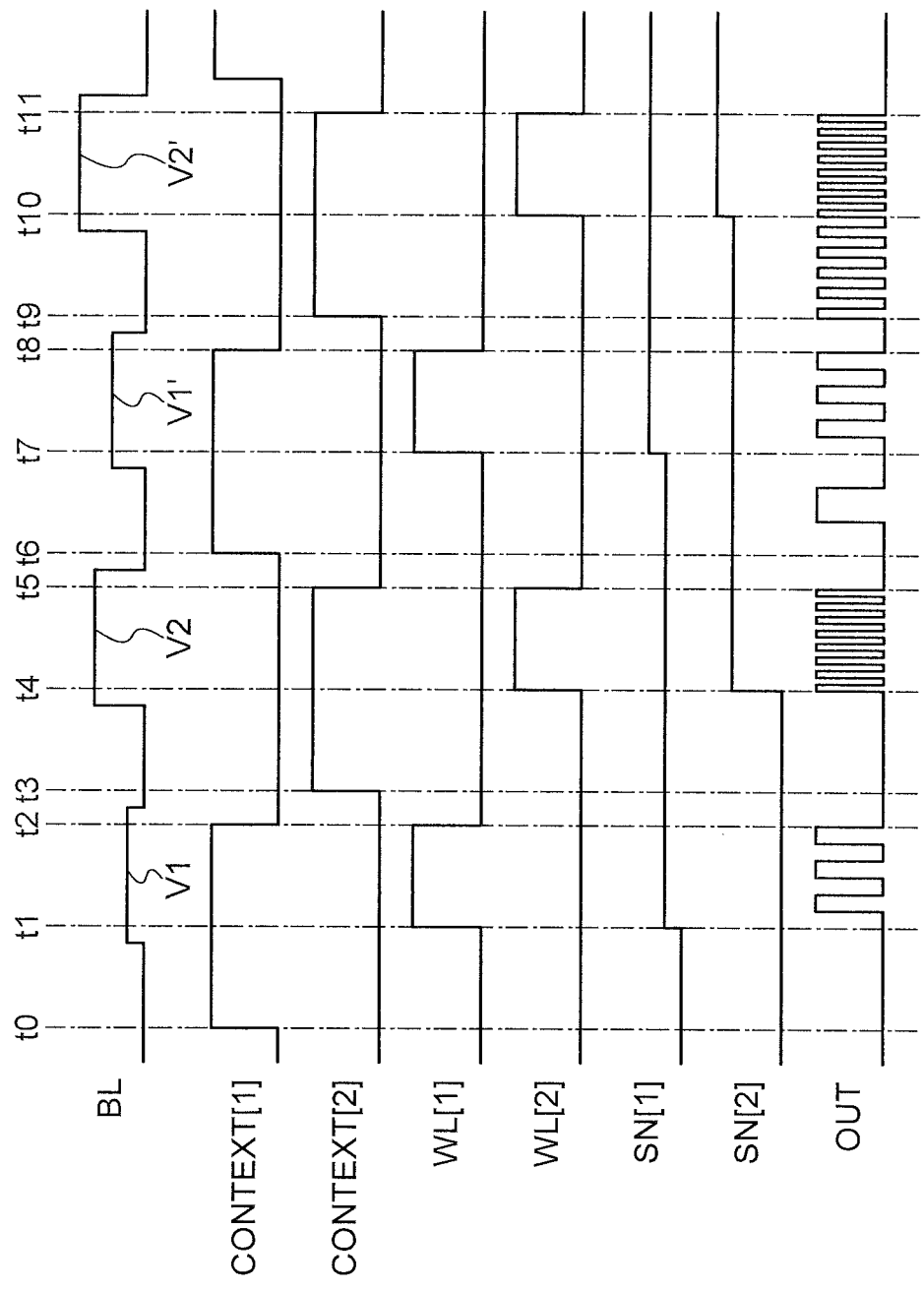
FIG. 6 illustrates a device operation.

Next, a method for storing data in each of the circuits 104[1] to 104[*m*] for accurately setting the frequency of the signal of the terminal OUT will be described with reference to FIG. 6.

Note that the case where m equals 2 is described for convenience. That is, the circuit 102 includes the circuit 104[1] and the circuit 104[2].

Note that in an initial state, data is not stored in the circuits 104[1] and 104[2]. That is, in each of the circuits 104[1] and 104[2], the node SN has a potential at which the transistor 106 is turned off.

At time t0, the wiring CONTEXT[1] is set at a high level. Accordingly, the transistor 107 in the circuit 104[1] is turned on. However, since the transistor 106 is off, the terminal C and the terminal D are electrically disconnected from each other. Thus, the device illustrated in FIG. 1 does not oscillate.

At time t1, the wiring WL[1] is set at a high level, and the wiring BL is set at a potential V1. Thus, the transistor 105 in the circuit 104[1] is turned on, and therefore, the potential V1 of the wiring BL is input to the node SN through the transistor 105, and charge based on the potential V1 is accumulated in the capacitor 108. In addition, the resistance between the source and the drain of the transistor 106 becomes a value based on the potential V1. Furthermore, since the transistor 107 in the circuit 104[1] is on, the device illustrated in FIG. 1 oscillates and the frequency of the signal of the terminal OUT becomes f(V1).

At time t2, the wiring CONTEXT[1] is set at a low level. Accordingly, the transistor 107 in the circuit 104[1] is turned off. Thus, the device illustrated in FIG. 1 stops oscillating.

At time t3, the wiring CONTEXT[2] is set at the high level. Accordingly, the transistor 107 in the circuit 104[2] is turned on. However, since the transistor 106 is off, the terminal C and the terminal D are electrically disconnected from each other. Thus, the device illustrated in FIG. 1 does not oscillate.

At time t4, the wiring WL[2] is set at the high level, and the wiring BL is set at a potential V2. Thus, the transistor 105 in the circuit 104[2] is turned on, and therefore, the potential V2 of the wiring BL is input to the node SN through the transistor 105, and charge based on the potential V2 is accumulated in the capacitor 108. In addition, the resistance between the source and the drain of the transistor 106 becomes a value based on the potential V2. Furthermore, since the transistor 107 in the circuit 104[2] is on, the device illustrated in FIG. 1 oscillates and the frequency of the signal of the terminal OUT becomes f(V2).

At time t5, the wiring CONTEXT[2] is set at the low level. Accordingly, the transistor 107 in the circuit 104[2] is turned off. Thus, the device illustrated in FIG. 1 stops oscillating.

At time t6, the wiring CONTEXT[1] is set at the high level. Accordingly, the transistor 107 in the circuit 104[1] is turned on. Thus, the device illustrated in FIG. 1 oscillates. Note that since the transistor 106 in the circuit 104[2] is on at time t6, the load between the terminal A and the terminal B of the circuit 102 is increased as compared with that at time t1. Therefore, the frequency of the signal of the terminal OUT at time t6 is lower than the frequency f(V1) of the signal of the terminal OUT at time t1.

At time t7, the wiring WL[1] is set at the high level, and the wiring BL is set at a potential V1'. Thus, the transistor 105 in the circuit 104[1] is turned on, and therefore, the potential V1' of the wiring BL is input to the node SN through the transistor 105, and charge based on the potential V1' is accumulated in the capacitor 108. In addition, the resistance between the source and the drain of the transistor 106 becomes a value based on the potential V1'. Furthermore, since the transistor 107 in the circuit 104[1] is on, the device illustrated in FIG. 1 oscillates. Here, the potential V1' has a value at which the frequency of the signal of the terminal OUT at time t7 is f(V1), and is higher than the potential V1. Thus, the frequency of the signal of the terminal OUT is substantially equal to f(V1).

At time t8, the wiring CONTEXT[1] is set at the low level. Accordingly, the transistor 107 in the circuit 104[1] is turned off. Thus, the device illustrated in FIG. 1 stops oscillating.

At time t9, the wiring CONTEXT[2] is set at the high level. Accordingly, the transistor 107 in the circuit 104[2] is turned on. Thus, the device illustrated in FIG. 1 oscillates. Note that the potential of the node SN in the circuit 104[1] at time t9 is higher than the potential of the node SN in the circuit 104[1] at time t4. That is, the resistance between the source and the drain of the transistor 106 in the circuit 104[1] at time t9 is lower than the resistance between the source and the drain of the transistor 106 in the circuit 104[1] at time t4. Alternatively, the gate capacitance of the transistor 106 in the circuit 104[1] at time t9 is larger than the gate capacitance of the transistor 106 in the circuit 104[1] at time t4. Thus, the load between the terminal A and the terminal B of the circuit 102 at time t9 is increased as compared with that at time t4. Therefore, the frequency of the signal of the terminal OUT at time t9 is lower than the frequency f(V2) of the signal of the terminal OUT at time t4.

At time t10, the wiring WL[2] is set at the high level, and the wiring BL is set at a potential V2'. Thus, the transistor 105 in the circuit 104[2] is turned on, and therefore, the potential V2' of the wiring BL is input to the node SN through the transistor 105, and charge based on the potential V2' is accumulated in the capacitor 108. In addition, the resistance between the source and the drain of the transistor 106 becomes a value based on the potential V2'. Furthermore, since the transistor 107 in the circuit 104[2] is on, the device illustrated in FIG. 1 oscillates. Here, the potential V2' has a value at which the frequency of the signal of the terminal OUT at time t7 is f(V2), and is higher than the potential V2. Thus, the frequency of the signal of the terminal OUT is substantially equal to f(V2).

At time t11, the wiring CONTEXT[2] is set at the low level. Accordingly, the transistor 107 in the circuit 104[2] is turned off. Thus, the device illustrated in FIG. 1 stops oscillating.

After that, by repeating the operation in a period from time t6 to time t11, the frequency of the signal of the terminal OUT at the time when the wiring CONTEXT[1] is set at the high level converges to f(V1), and the frequency of the signal of the terminal OUT at the time when the wiring CONTEXT[2] is set at the high level converges to f(V2).

This embodiment can be implemented in appropriate combination with any of the configurations disclosed in the other embodiments and the like in this specification and the like.

Embodiment 2

In this embodiment, a PLL in which the device described in Embodiment 1 is used will be described.

Figure 7:
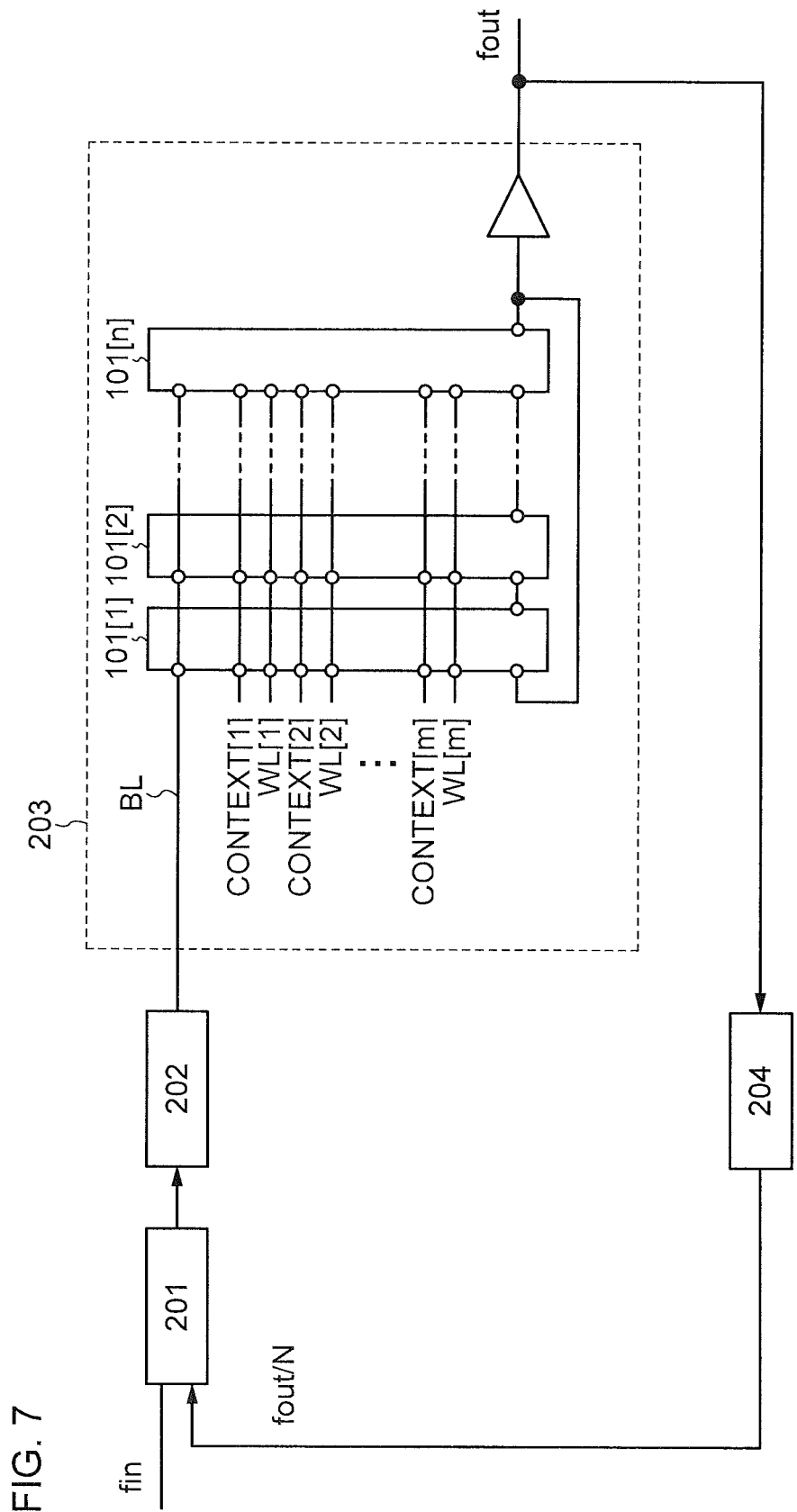
FIG. 7 illustrates a PLL configuration.

A PLL illustrated in FIG. 7 includes a phase comparator 201, a loop filter 202, a voltage-controlled oscillator 203, and a frequency divider 204.

The phase comparator 201 has a function of detecting a phase difference between two input signals and outputting a detection result as a voltage signal. That is, the phase comparator 201 has a function of outputting a phase difference between a signal with frequency $f_{in}$ and a signal with frequency $f_{out}/N$ as a voltage signal.

The loop filter 202 has a function of generating a direct-current voltage signal DATA which is to be input to the voltage-controlled oscillator 203. In addition, the loop filter 202 has a function of removing a high-frequency component from an output signal of the phase comparator 201. An example of the loop filter 202 is a low-pass filter.

The voltage-controlled oscillator 203 has a function of outputting a clock signal with a particular oscillation frequency depending on DATA. As the voltage-controlled oscillator 203, the device illustrated in FIG. 1 can be employed. Note that DATA corresponds to the potential of the wiring BL. Note that the device illustrated in FIG. 1 may output a signal through a buffer as illustrated in FIG. 7.

The frequency divider 204 has a function of generating a clock signal which is 1/N times the clock signal with the particular oscillation frequency that is output from the voltage-controlled oscillator 203.

Note that DATA corresponds to the potential of the wiring BL. DATA can be controlled by changing N for the frequency divider 204. That is, data to be stored in each of circuits 101[1] to 101[n] of the voltage-controlled oscillator 203 can be controlled by changing N for the frequency divider 204.

This embodiment can be implemented in appropriate combination with any of the configurations disclosed in the other embodiments and the like in this specification and the like.

Embodiment 3

<Example of Cross-Sectional Structure of Semiconductor Device>

Figure 8:
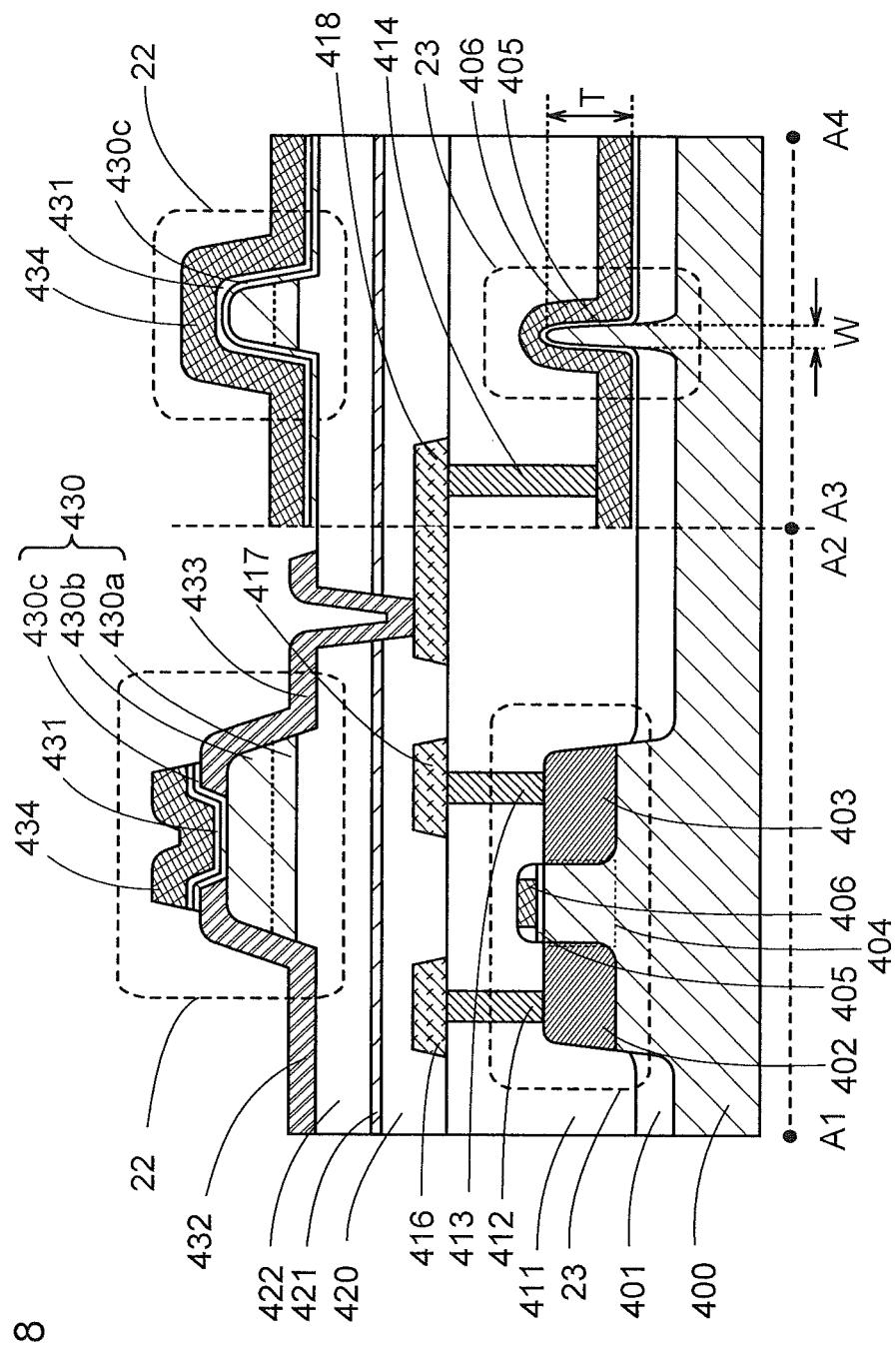
FIG. 8 illustrates a cross-sectional structure of a device.

FIG. 8 illustrates an example of a cross-sectional structure of the device illustrated in FIG. 1. A transistor 22 corresponds to the transistor 105, and a transistor 23 corresponds to the transistor 106. A region along dashed line A1-A2 shows a structure of the transistors 22 and 23 in the channel length direction, and a region along dashed line A3-A4 shows a structure of the transistors 22 and 23 in the channel width direction. Note that in one embodiment of the present invention, the channel length direction of the transistor 22 is not necessarily aligned with the channel length direction of the transistor 23.

The channel length direction refers to a direction in which a carrier moves between a source (source region or source electrode) and a drain (drain region or drain electrode), and the channel width direction refers to a direction perpendicular to the channel length direction in a plane parallel to a substrate.

In FIG. 8, the transistor 22 including a channel formation region in an oxide semiconductor film is formed over the transistor 23 including a channel formation region in a single crystal silicon substrate.

The transistor 23 may include the channel formation region in a semiconductor film or a semiconductor substrate of silicon, germanium, or the like in an amorphous, microcrystalline, polycrystalline, or single crystal state. Alternatively, the transistor 23 may include the channel formation region in an oxide semiconductor film or an oxide semiconductor substrate. In the case where the transistors each include a channel formation region in an oxide semiconductor film or an oxide semiconductor substrate, the transistor 22 is not necessarily stacked over the transistor 23, and the transistors 22 and 23 may be formed in the same layer.

In the case where the transistor 23 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor 23 is formed can be, for example, a silicon substrate, a germanium substrate, or a silicon germanium substrate. In FIG. 8, a single crystal silicon substrate is used as the substrate 400.

The transistor 23 is electrically isolated by an element isolation method. As the element isolation method, a trench isolation method (a shallow trench isolation (STI) method) or the like can be used. FIG. 8 illustrates an example where the trench isolation method is used to electrically isolate the transistor 23. Specifically, in FIG. 8, the transistor 23 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 23 and a channel formation region 404 placed between the impurity regions 402 and 403 are provided. Further, the transistor 23 includes an insulating film 405 covering the channel formation region 404 and a gate electrode 406 that overlaps with the channel formation region 404 with the insulating film 405 provided therebetween.

In the transistor 23, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 23 can be reduced, and the number of transferred carriers in the transistor 23 can be increased. As a result, the on-state current and field-effect mobility of the transistor 23 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 23 can be further increased and the field-effect mobility of the transistor 23 can be further increased.

Note that when the transistor 23 is formed using a bulk semiconductor substrate, the aspect ratio is preferably 0.5 or more, further preferably 1 or more.

An insulating film 411 is provided over the transistor 23. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor 22 is provided over the insulating film 422.

The transistor 22 includes, over the insulating film 422, a semiconductor film 430 including an oxide semiconductor, conductive films 432 and 433 functioning as source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween. Note that an opening is formed in the insulating films 420 to 422. The conductive film 433 is connected to the conductive film 418 in the opening.

Note that in FIG. 8, the transistor 22 includes at least the gate electrode 434 on one side of the semiconductor film 430, and may further include a gate electrode overlapping with the semiconductor film 430 with the insulating film 422 positioned therebetween.

In the case where the transistor 22 has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 8, the transistor 22 has a single-gate structure where one channel formation region corresponding to one gate electrode 434 is provided. However, the transistor 22 may have a multi-gate structure where a plurality of electrically connected gate electrodes are provided so that a plurality of channel formation regions are included in one active layer.

FIG. 8 illustrates an example in which the semiconductor film 430 included in the transistor 22 includes oxide semiconductor films 430a to 430c that are stacked in this order over the insulating film 422. Note that in one embodiment of the present invention, the semiconductor film 430 of the transistor 22 may be formed using a single-layer metal oxide film.

<Transistor>

Next, an example of a structure of a transistor 90 that includes a channel formation region in an oxide semiconductor film will be described.

Figure 9A:
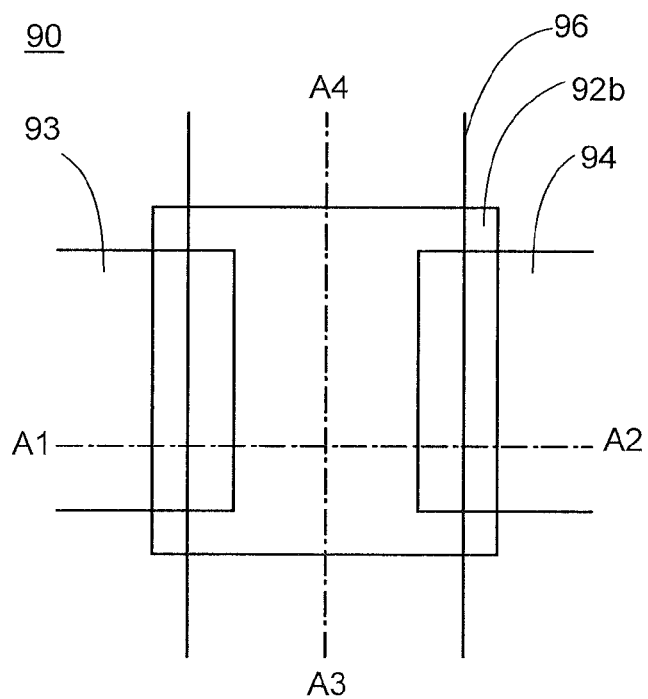
FIGS. 9A to 9C illustrate a structure of a transistor.
Figure 9C:
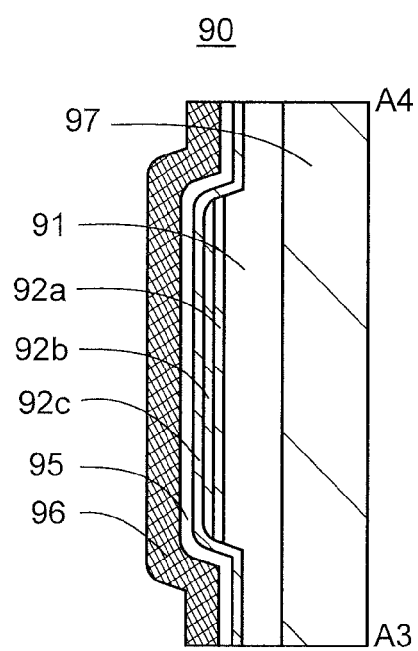
Figure 9B:
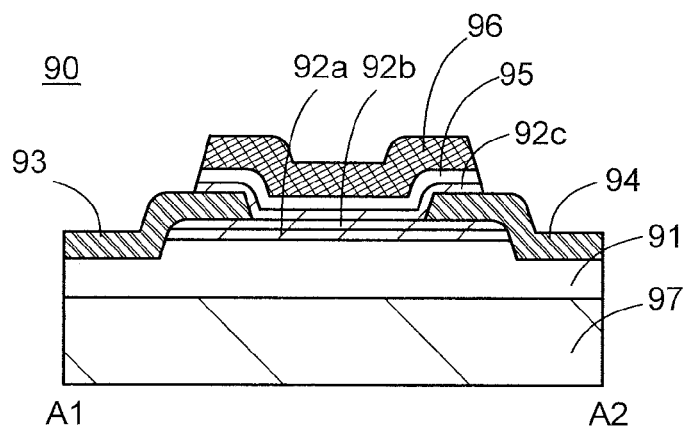

FIGS. 9A to 9C illustrate a structure of the transistor 90 that includes a channel formation region in an oxide semiconductor film as an example. FIG. 9A is a top view of the transistor 90. Note that insulating films are not illustrated in FIG. 9A in order to clarify the layout of the transistor 90. FIG. 9B is a cross-sectional view along the dashed line A1-A2 in the top view in FIG. 9A. FIG. 9C is a cross-sectional view along the dashed line A3-A4 in the top view in FIG. 9A.

As illustrated in FIGS. 9A to 9C, the transistor 90 includes an oxide semiconductor film 92a and an oxide semiconductor film 92b that are stacked in this order over an insulating film 91 formed over a substrate 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor films 92a to 92c. Note that the substrate 97 may be a glass substrate, a semiconductor substrate, or the like or may be an element substrate where semiconductor elements are formed over a glass substrate or on a semiconductor substrate.

Figure 10A:
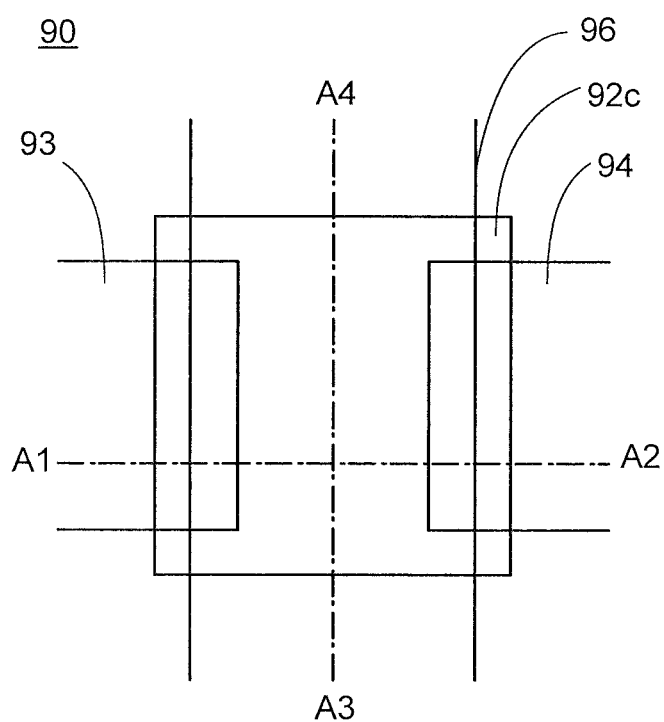
FIGS. 10A to 10C illustrate a structure of a transistor.
Figure 10C:
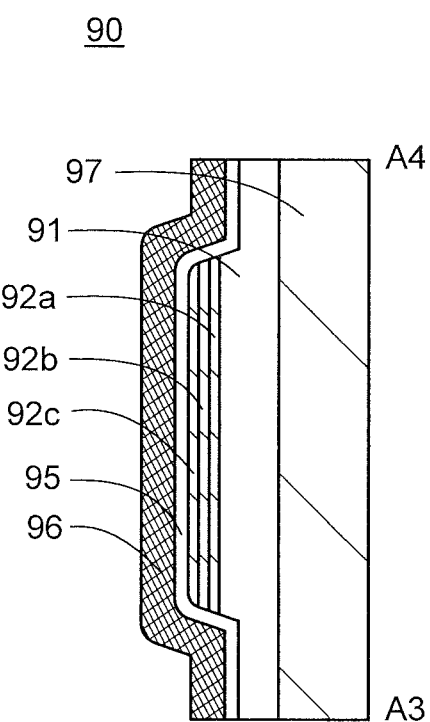
Figure 10B:
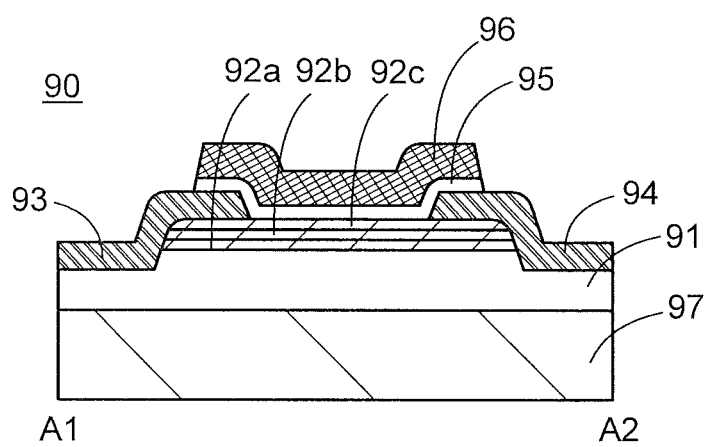

FIGS. 10A to 10C illustrate another specific example of the structure of the transistor 90. FIG. 10A is a top view of the transistor 90. Note that insulating films are not illustrated in FIG. 10A in order to clarify the layout of the transistor 90. FIG. 10B is a cross-sectional view along the dashed line A1-A2 in the top view in FIG. 10A. FIG. 10C is a cross-sectional view along the dashed line A3-A4 in the top view in FIG. 10A.

As illustrated in FIGS. 10A to 10C, the transistor 90 includes the oxide semiconductor films 92a to 92c that are stacked in this order over the insulating film 91; the conductive films 93 and 94 that are electrically connected to the oxide semiconductor film 92c and function as a source electrode and a drain electrode; the insulating film 95 that functions as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

FIGS. 9A to 9C and FIGS. 10A to 10C each illustrate the structural example of the transistor 90 in which the oxide semiconductor films 92a to 92c are stacked. However, the structure of the oxide semiconductor film included in the transistor 90 is not limited to a stacked-layer structure including a plurality of oxide semiconductor films and may be a single-layer structure.

In the case where the transistor 90 includes the semiconductor film in which the semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at an interface between the oxide semiconductor films 92b and 92a, a channel region is also formed in a region close to the interface; thus, the threshold voltage of the transistor 90 varies. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure can reduce variations in electrical characteristics of the transistor 90, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1/y_1$ is preferably greater than or equal to 1/3 and less than or equal to 6, further preferably greater than or equal to 1 and less than or equal to 6, and $z_1/y_1$ is preferably greater than or equal to 1/3 and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1 and In:M:Zn=3:1:2.

Specifically, in the case where the oxide semiconductor film 92a and the oxide semiconductor film 92c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 92a and 92c, $x_2/y_2$ is preferably less than $x_1/y_1$, and $z_2/y_2$ is preferably greater than or equal to 1/3 and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, in which case the transistor 90 can have stable electrical characteristics.

Note that a channel formation region refers to a region of a semiconductor film of the transistor 90 that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor film 92b is a CAAC-OS film, the oxide semiconductor film 92b is preferably deposited with the use of a target containing a polycrystalline In—Ga—Zn oxide (In:Ga:Zn=1:1:1 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 92a to 92c can be formed by a sputtering method, they may be formed by another method, e.g., a thermal CVD method. A metal organic chemical vapor deposition (MOCVD) method or an atomic layer deposition (ALD) method may be employed as an example of a thermal CVD method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor film. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In that case, it can be seen that off-state current of the transistor normalized on the channel width is lower than or equal to 100 zA/μm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charges of the capacitor per unit time. As a result, it can be seen that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included in the oxide semiconductor film. In addition, as a stabilizer for reducing variations in electrical characteristics among transistors formed using such an oxide semiconductor film, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 90, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. Examples of such a conductive material include Al, Cr, Cu, Ta, Ti, Mo, and W.

Furthermore, in the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typically the spin density at g=2.001 due to a dangling bond of silicon be lower than or equal to $1\times10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 90 illustrated in FIGS. 9A to 9C or FIGS. 10A to 10C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, it can be considered that, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 90 illustrated in FIGS. 9A to 9C or FIGS. 10A to 10C. Consequently, current that flows between the conductive films 93 and 94 through the end portions of the oxide semiconductor film 92b can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, in the transistor 90, even when the distance between the conductive films 93 and 94 at the end portions of the oxide semiconductor film 92b is reduced as a result of reducing the channel length to obtain high on-state current, the transistor 90 can have low off-state current. Consequently, with the short channel length, the transistor 90 can have high on-state current when in an on state and low off-state current when in an off state.

With the s-channel structure, specifically, when a potential at which the transistor 90 is turned on is supplied to the conductive film 96, the amount of current that flows between the conductive films 93 and 94 through the end portions of the oxide semiconductor film 92b can be increased. The current contributes to an increase in the field-effect mobility and an increase in the on-state current of the transistor 90. When the end portions of the oxide semiconductor film 92b overlap with the conductive film 96, carriers flow in a wide region of the oxide semiconductor film 92b without being limited to a region in the vicinity of the interface between the oxide semiconductor film 92b and the insulating film 95, which results in an increase in the amount of carrier movement in the transistor 90. As a result, the on-state current of the transistor 90 is increased, and the field-effect mobility is increased to greater than or equal to 10 $cm^2/V \cdot s$ or to greater than or equal to 20 $cm^2/V \cdot s$, for example. Note that here, the field-effect mobility is not an approximate value of the mobility as the physical property of the oxide semiconductor film but is the apparent field-effect mobility in a saturation region of the transistor, which is an index of current drive capability.

A structure of an oxide semiconductor film is described below.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film varies depending on the structure in some cases. For example, when the composition of an oxide semiconductor film is determined, the structure of the oxide semiconductor film can be expected by comparing the density of the oxide semiconductor film with the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film having a density of lower than 78% of the density of the single crystal oxide semiconductor.

Specific examples of the above description are given. For example, in the case of an oxide semiconductor film having an atomic ratio of In:Ga:Zn=1:1:1, the density of single crystal $InGaZnO_4$ with a rhombohedral crystal structure is 6.357 g/cm³. Accordingly, in the case of the oxide semiconductor film having an atomic ratio of In:Ga:Zn=1:1:1, the density of the a-like OS film is higher than or equal to 5.0 g/cm³ and lower than 5.9 g/cm³. For example, in the case of the oxide semiconductor film having an atomic ratio of In:Ga:Zn=1:1:1, the density of each of the nc-OS film and the CAAC-OS film is higher than or equal to 5.9 g/cm³ and lower than 6.3 g/cm³.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate surface, so that a flat plane of the sputtered particle is attached to the substrate.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, 2:1:3, or 3:1:2. The kinds of powders and the molar ratio for mixing powders may be determined as appropriate depending on the desired target. A CAAC-OS film formed using a target with a molar ratio of In:Ga:Zn=2:1:3 can have a particularly high proportion of regions where a diffraction pattern of CAAC-OS is observed in a predetermined area (also referred to as proportion of CAAC); thus, a transistor having a channel formation region in this CAAC-OS film can have excellent frequency characteristics.

An alkali metal is not an element included in an oxide semiconductor and thus is an impurity. Likewise, an alkaline earth metal is an impurity when the alkaline earth metal is not a component of the oxide semiconductor. When an insulating film in contact with an oxide semiconductor film is an oxide, Na, among the alkali metals, diffuses into the insulating film and becomes $Na^+$. Further, in the oxide semiconductor film, Na cuts or enters a bond between metal and oxygen which are components of the oxide semiconductor. As a result, the electrical characteristics of the transistor deteriorate; for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably $5 \times 10^{16}/cm^3$ or lower, further preferably $1 \times 10^{16}/cm^3$ or lower, still further preferably $1 \times 10^{15}/cm^3$ or lower. Similarly, the measurement value of a Li concentration is preferably $5 \times 10^{15}/cm^3$ or lower, further preferably $1 \times 10^{15}/cm^3$ or lower. Similarly, the measurement value of a K concentration is preferably $5 \times 10^{15}/cm^3$ or lower, further preferably $1 \times 10^{15}/cm^3$ or lower.

When metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electrical characteristics of the transistor are likely to deteriorate as in the case of using an alkali metal or an alkaline earth metal. Thus, the concentrations of silicon and carbon in the oxide semiconductor film are preferably low. Specifically, the carbon concentration or the silicon concentration measured by secondary ion mass spectrometry is $1 \times 10^{18}/cm^3$ or lower. In this case, the deterioration of the electrical characteristics of the transistor can be prevented, so that the reliability of a semiconductor device can be improved.

<Example of Cross-Sectional Structure of Semiconductor Device>

Figure 11:
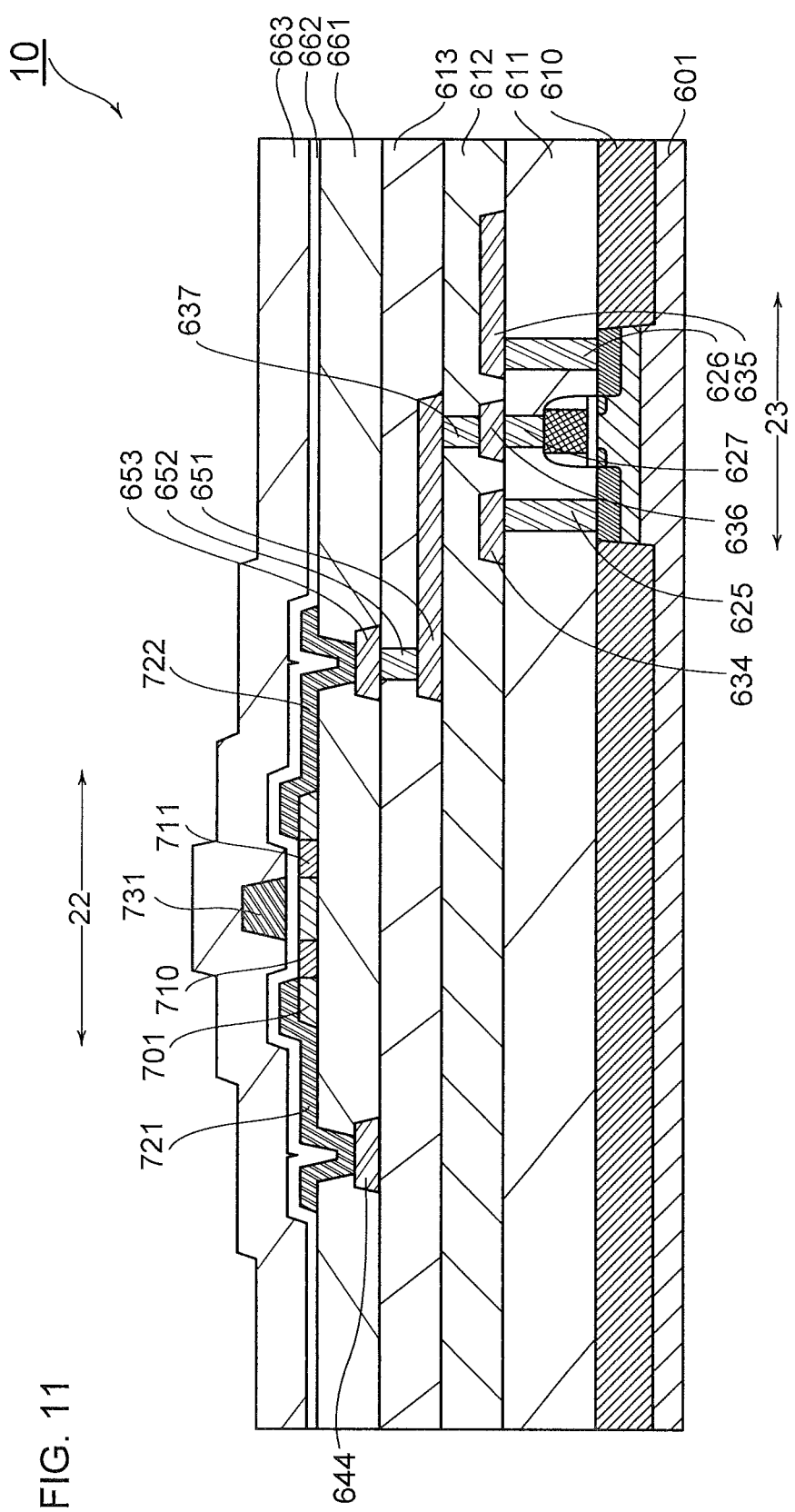
FIG. 11 illustrates a cross-sectional structure of a semiconductor device.

FIG. 11 illustrates an example of a cross-sectional structure of the device illustrated in FIG. 1.

In FIG. 11, the transistor 22 including a channel formation region in an oxide semiconductor film is formed over the transistor 23 including a channel formation region in a single crystal silicon substrate.

The transistor 23 may include the channel formation region in a semiconductor film or a semiconductor substrate of silicon, germanium, or the like in an amorphous, microcrystalline, polycrystalline, or single crystal state. Alternatively, the transistor 23 may include the channel formation region in an oxide semiconductor film or an oxide semiconductor substrate. In the case where the transistors each include a channel formation region in an oxide semiconductor film or an oxide semiconductor substrate, the transistor 22 is not necessarily stacked over the transistor 23, and the transistors 22 and 23 may be formed in the same layer.

In the case where the transistor 23 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 601 where the transistor 23 is formed can be, for example, a silicon substrate, a germanium substrate, or a silicon germanium substrate. In FIG. 11, a single crystal silicon substrate is used as the semiconductor substrate 601.

The transistor 23 is electrically isolated by an element isolation method. As the element isolation method, a selective oxidation method (a local oxidation of silicon (LOCOS) method), a trench isolation method (a shallow trench isolation (STI) method), or the like can be used. FIG. 11 illustrates an example where the trench isolation method is used to electrically isolate the transistor 23. Specifically, in FIG. 11, the transistor 23 is electrically isolated by element isolation using an element isolation region 610 formed in such a manner that an insulator including silicon oxide or the like is buried in a trench formed in the semiconductor substrate 601 by etching or the like.

An insulating film 611 is provided over the transistor 23. Openings are formed in the insulating film 611. Conductive films 625 and 626 that are electrically connected to the source and the drain of the transistor 23 and a conductive film 627 that is electrically connected to the gate of the transistor 23 are formed in the openings.

The conductive film 625 is electrically connected to a conductive film 634 formed over the insulating film 611. The conductive film 626 is electrically connected to a conductive film 635 formed over the insulating film 611. The conductive film 627 is electrically connected to a conductive film 636 formed over the insulating film 611.

An insulating film 612 is formed over the conductive films 634 and 635. An opening is formed in the insulating film 612. A conductive film 637 electrically connected to the conductive film 636 is formed in the opening. The conductive film 637 is electrically connected to a conductive film 651 formed over the insulating film 612.

An insulating film 613 is formed over the conductive film 651. An opening is formed in the insulating film 613. A conductive film 652 electrically connected to the conductive film 651 is formed in the opening. The conductive film 652 is electrically connected to a conductive film 653 formed over the insulating film 613. A conductive film 644 is formed over the insulating film 613.

An insulating film 661 is formed over the conductive film 653 and the conductive film 644. In FIG. 11, the transistor 22 is formed over the insulating film 661.

The transistor 22 includes, over the insulating film 661, a semiconductor film 701 including an oxide semiconductor, conductive films 721 and 722 functioning as source and drain electrodes over the semiconductor film 701, a gate insulating film 662 over the semiconductor film 701 and the conductive films 721 and 722, and a gate electrode 731 overlapping with the semiconductor film 701 over the gate insulating film 662 and between the conductive films 721 and 722. Note that the conductive film 722 is electrically connected to the conductive film 653 in the opening formed in the insulating film 661.

In the semiconductor film 701 of the transistor 22, there is a region 710 between a region overlapping with the conductive film 721 and a region overlapping with the gate electrode 731. In addition, in the semiconductor film 701 of the transistor 22, there is a region 711 between a region overlapping with the conductive film 722 and the region overlapping with the gate electrode 731. When an inert gas such as argon, an impurity which imparts p-type conductivity to the semiconductor film 701, or an impurity which imparts n-type conductivity to the semiconductor film 701 is added to the regions 710 and 711 using the conductive films 721 and 722 and the gate electrode 731 as a mask, the resistivity of the regions 710 and 711 can be made lower than that of the region overlapping with the gate electrode 731 in the semiconductor film 701.

An insulating film 663 is provided over the transistor 22.

In FIG. 11, the transistor 22 has the gate electrode 731 on at least one side of the semiconductor film 701; alternatively, the transistor 22 may have a pair of gate electrodes with the semiconductor film 701 positioned therebetween.

In the case where the transistor 22 has a pair of gate electrodes with the semiconductor film 701 positioned therebetween, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 11, the transistor 22 has a single-gate structure where one channel formation region corresponding to one gate electrode 731 is provided. However, the transistor 22 may have a multi-gate structure where a plurality of electrically connected gate electrodes are provided so that a plurality of channel formation regions are included in one active layer.

This embodiment can be implemented in appropriate combination with any of the configurations disclosed in the other embodiments and the like in this specification and the like.

Embodiment 4

<Examples of Electronic Devices>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 12A to 12F illustrate specific examples of these electronic devices.

Figure 12A:
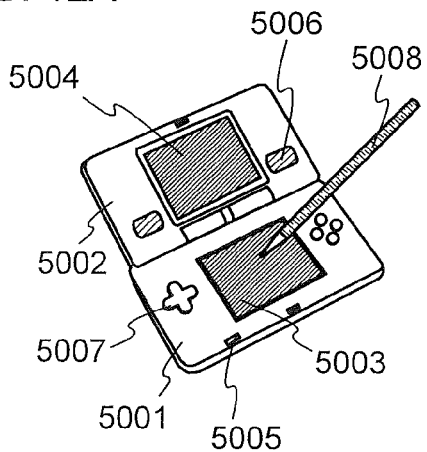
FIGS. 12A to 12F illustrate electronic devices.

FIG. 12A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 12A has the two display portions 5003 and 5004, the number of display portions included in a portable game machine is not limited to this.

Figure 12B:
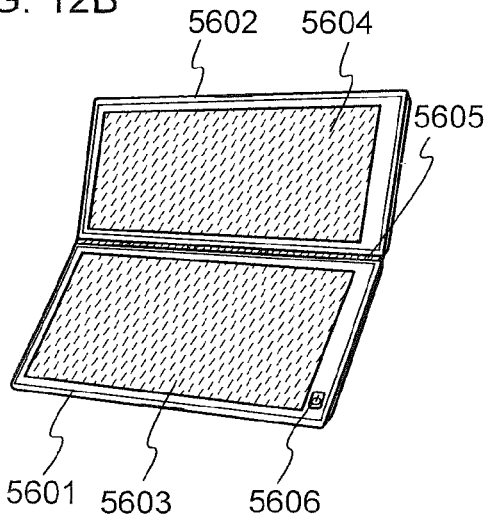

FIG. 12B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 12C:
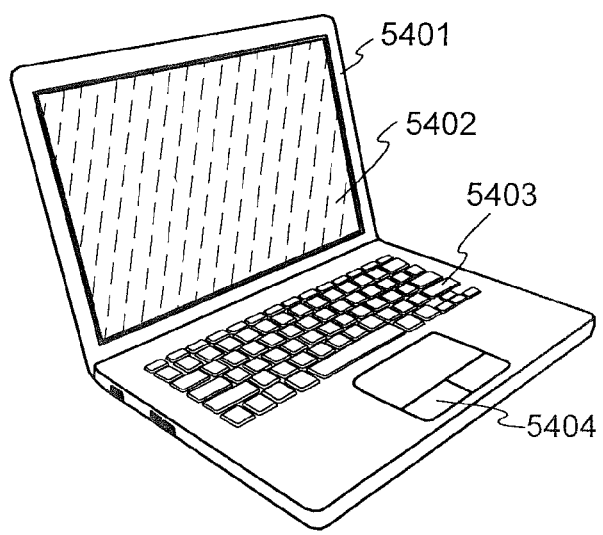

FIG. 12C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 12D:
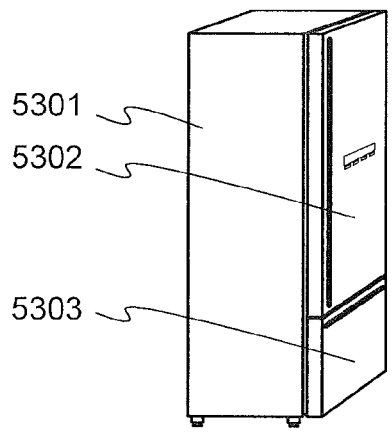

FIG. 12D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 12E:
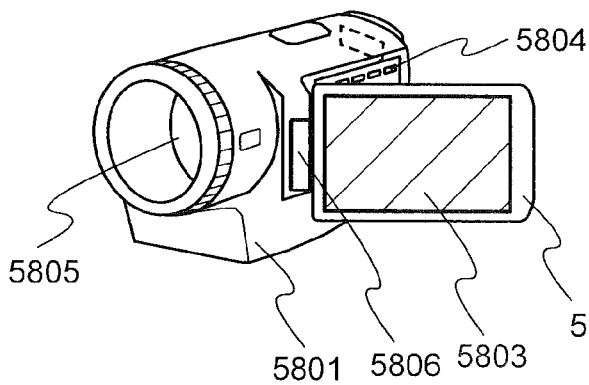

FIG. 12E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 12F:
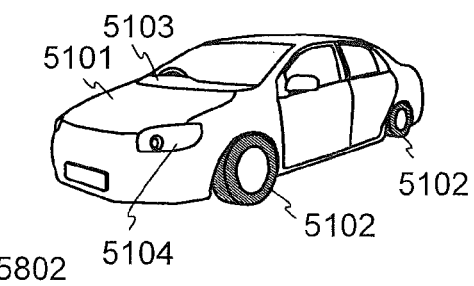

FIG. 12F illustrates a passenger car including a car body 5101, wheels 5102, a dashboard 5103, lights 5104, and the like. The semiconductor device of one embodiment of the present invention can be used for a variety of integrated circuits included in passenger cars.

Note that in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y.

Note that an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values or the like is described, the range may be freely narrowed or a value in the range may be excluded, so that one embodiment of the invention can be specified by a range part of which is excluded. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, the description of a value, "a voltage is preferably higher than or equal to 3 V and lower than or equal to 10 V" is given. In that case, for example, it can be specified that the case where the voltage is higher than or equal to $-2$ V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, the description "a voltage is preferably 10 V" is given. In that case, for example, it can be specified that the case where the voltage is higher than or equal to $-2$ V and lower than or equal to 1 V is excluded from one embodiment of the invention. For example, it can be specified that the case where the voltage is higher than or equal to 13 V is excluded from one embodiment of the invention.

As another specific example, the description "a film is an insulating film" is given to describe a property of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a layered film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the embodiment of the invention. For example, in the case of a transmission and reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission and reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the invention is clear. Moreover, it can be determined that one embodiment of the invention in which a function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) to constitute one embodiment of the invention. For another example, it is possible to take out M layers (M is an integer, where M<N) from a cross-sectional view in which N layers (N is an integer) are provided, to constitute one embodiment of the invention. For another example, it is possible to take out M elements (M is an integer, where M<N) from a flow chart in which N elements (N is an integer) are provided, to constitute one embodiment of the invention. For another example, it is possible to take out some given elements from a sentence "A includes B, C, D, E, or F" to constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, what is illustrated in at least a diagram (which may be part of the diagram) is disclosed as one embodiment of the invention, and one embodiment of the invention can be constituted. Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the invention is clear.

Example 1

In this example, a prototype voltage-controlled oscillator (VCO) will be described. The prototype VCO was fabricated using a transistor (OS FET) including a channel formation region in a CAAC-OS film of an In—Ga—Zn oxide.

The prototype VCO has the circuit configuration in FIGS. 1 and 2. The prototype VCO includes the circuits 101[1] to 101[n], where n=101. The prototype VCO further includes the circuit 104[1] to 104[m] in the circuit 102, where m=4.

In the circuits 104[1] to 104[m], the OS FET has a channel width of 4 μm and a Si FET has a channel width of 16 μm. The OS FET is used as the transistor 105, and the Si FET is used as each of the transistors 106 and 107.

Measurement was conducted with the inverter 103 included in the VCO driven at different voltages of 1.0 V, 1.5 V, and 2.5 V. The drive voltage of the transistor 107 was 2.5 V. The transistor 105 includes a back gate, to which a voltage of −9.0 V was applied. Time for writing through the transistor 105 was set to 500 μs.

Figure 13A:
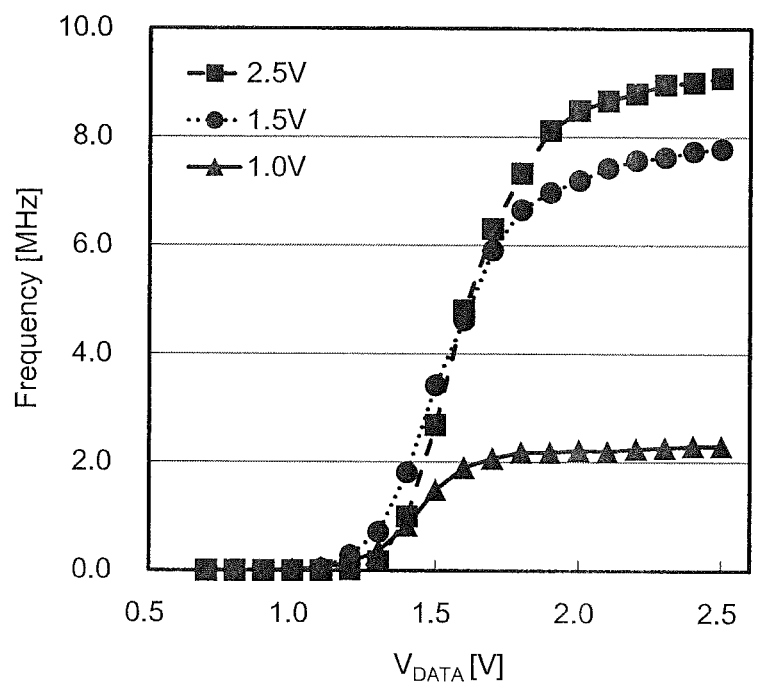
FIGS. 13A and 13B are each a graph showing a device operation.
Figure 13B:
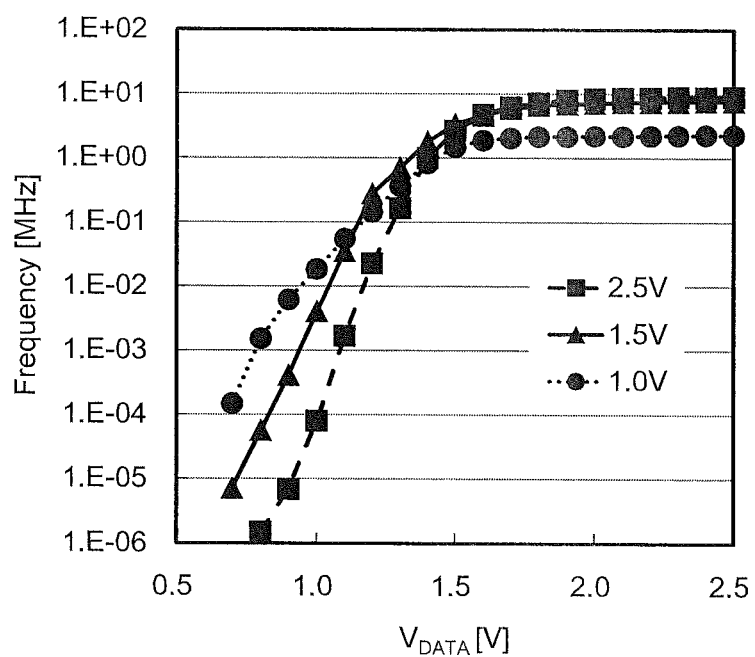

FIGS. 13A and 13B are each a graph showing the relationship between a voltage ($V_{DATA}$) applied to the node SN through the wiring BL and the oscillation frequency of the VCO. FIG. 13A is a graph with a linear scale, and FIG. 13B is a graph with a log scale.

The oscillation frequency of only the circuit 104[1] was measured at different values of $V_{DATA}$. FIGS. 13A and 13B show that the oscillation frequency can be controlled simply by changing $V_{DATA}$.

Values of the oscillation frequency measured under conditions where the drive voltage of the inverter 103 was 1.5 V were 7.20 Hz at a $V_{DATA}$ of 0.7 V and 7.83 MHz at a $V_{DATA}$ of 2.5 V. This suggests that when $V_{DATA}$ is in the range from 0.7 V to 2.5 V, the oscillation frequency can vary over approximately six orders of magnitude.

Note that in a range where $V_{DATA}$ is high, i.e., higher than 1.3 V, the delay of the inverter 103 appears to be dominant and the oscillation frequency is less dependent on $V_{DATA}$. In contrast, in a region where $V_{DATA}$ is low, i.e., lower than or equal to 1.3 V, the oscillation frequency is more dependent on $V_{DATA}$.

In the cases where the inverter 103 was driven at 1.0 V and 2.5 V, respective maximum oscillation frequencies were 2.30 MHz and 9.09 MHz. In the cases where the inverter 103 was driven at 1.0 V and 2.5 V, respective maximum increase rates of the oscillation frequency with respect to $V_{DATA}$ were 0.47 decades per 100 mV and 1.08 decades per 100 mV.

It is preferable that the drive voltage of the inverter 103 can be changed depending on the intended use of the VCO. In one example, the drive voltage of the inverter 103 is set high for the use in which a wide frequency range is required, and the drive voltage of the inverter 103 is set low for the use in which delicate frequency control is required.

Figure 14A:
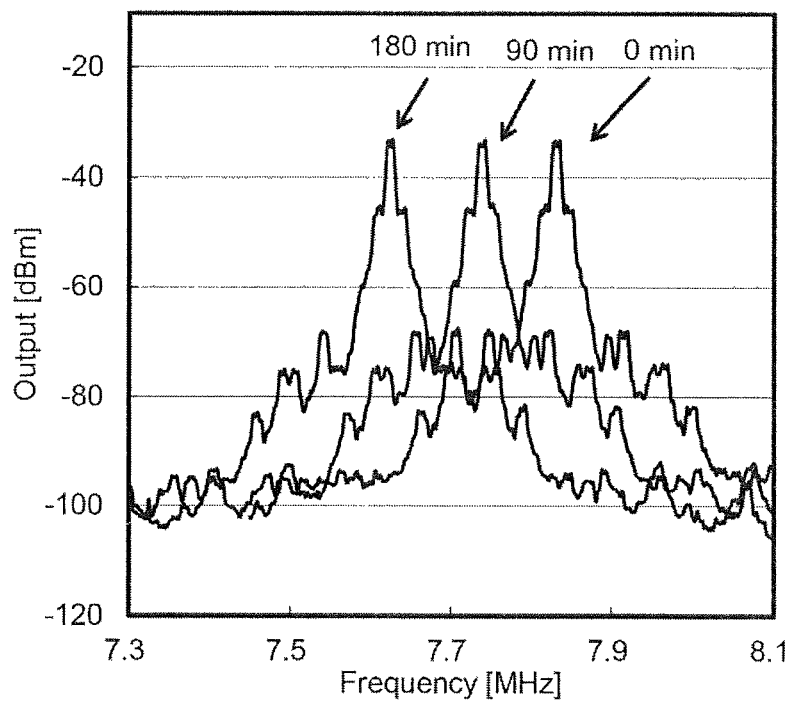
FIGS. 14A and 14B are each a graph showing a device operation.
Figure 14B:
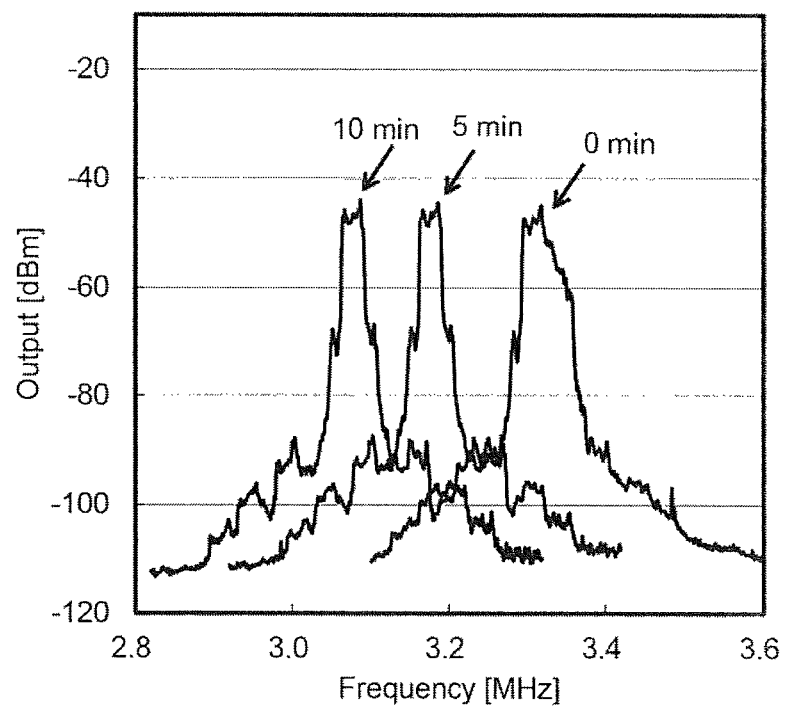

FIGS. 14A and 14B are each a graph showing the spectrum of the oscillation frequency of the VCO and its change over time, which is obtained when the inverter 103 is driven at 1.5 V and $V_{DATA}$ is set to 2.5 V or 1.5 V. In other words, FIGS. 14A and 14B are each a graph showing the characteristics of retention of oscillation frequency changed by the VCO.

FIG. 14A is a graph obtained when $V_{DATA}$ is set to 2.5 V. Three spectra shown in FIG. 14A are obtained at 0 min shortly after $V_{DATA}$ is applied to the node SN through the wiring BL, after 90 min, and after 180 min, respectively.

FIG. 14B is a graph obtained when $V_{DATA}$ is set to 1.5 V. Three spectra shown in FIG. 14B are obtained at 0 min shortly after $V_{DATA}$ is applied to the node SN through the wiring BL, after 5 min, and after 10 min.

When $V_{DATA}$ was set to 2.5 V and 1.5 V, the VCO consumed powers of 795 μW and 336 μW, respectively. From these consumed powers, respective figures of merit (FOMs) were estimated to be −127.7 dBc/Hz and −134.3 dBc/Hz.

In the case shown in FIG. 14A where $V_{DATA}$ was 2.5 V, the change in peak position of the oscillation frequency over 90 min was as small as −1.2%. In contrast, in the case shown in FIG. 14B where $V_{DATA}$ was 1.5 V, the change in peak position of the oscillation frequency in 5 min was −4.0%.

In the case where $V_{DATA}$ is around 1.5 V, the increase rate of the oscillation frequency with respect to a change in $V_{DATA}$ is higher than in the case where $V_{DATA}$ is around 2.5 V. Therefore, a slight change in $V_{DATA}$ applied to the node SN affects the change in peak position of the oscillation frequency.

The above results indicate that the oscillation frequency of the VCO can be kept constant by resetting $V_{DATA}$ by conducting refresh operations at long and regular intervals. In addition, changing the interval between refresh operations in accordance with $V_{DATA}$ is also effective.

Figure 15:
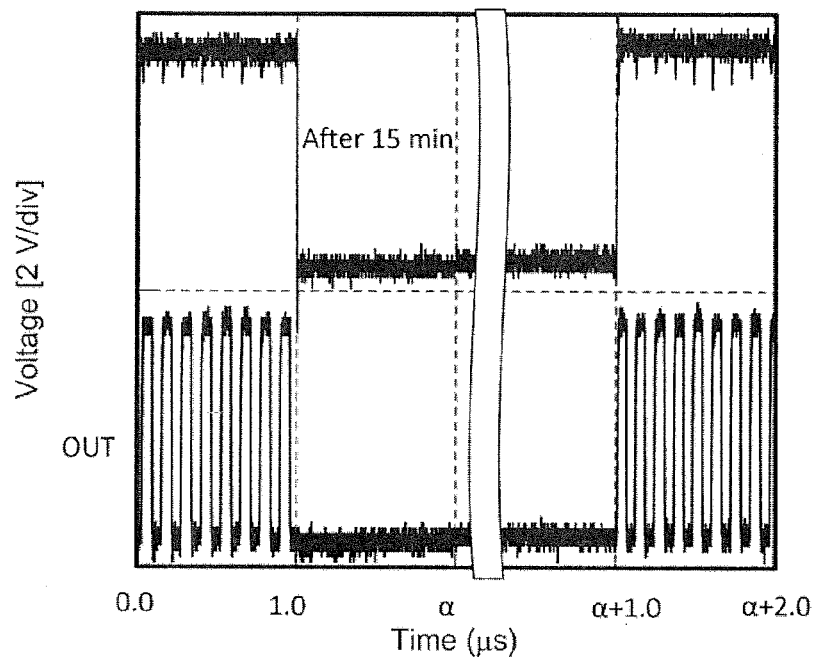
FIG. 15 is a graph showing a device operation.

The prototype VCO can retain an analog potential at the node SN and can maintain the oscillation frequency also at the time of restart after the stop of power supply. FIG. 15 shows waveforms obtained at the terminal OUT of the VCO at the time of restart from a power supply stop state in the case where $V_{DATA}$ is 2.5 V, for example.

The waveforms in FIG. 15 show that oscillation is resumed within 30 ns by restart from the power supply stop state at time (α+1.0) μs. Note that α is 15 min in FIG. 15. That is, FIG. 15 shows that oscillation is favorably resumed even after 15 min.

Figure 16:
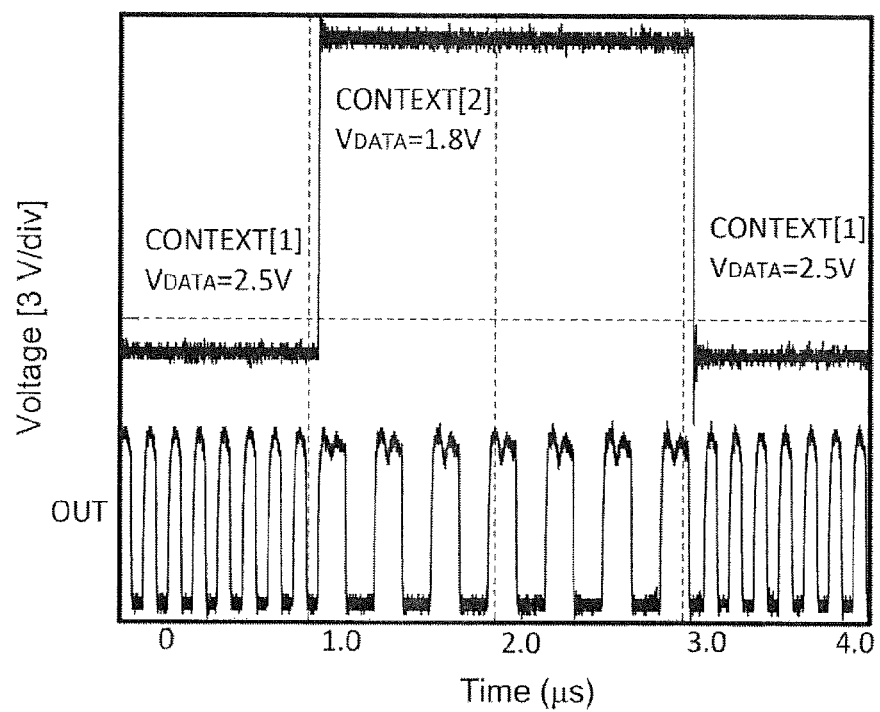
FIG. 16 is a graph showing a device operation.

The prototype VCO can instantly change the oscillation frequency when different analog potentials of $V_{DATA}$ are set for the circuits 104[1] to 104[m]. FIG. 16 shows waveforms obtained at the terminal OUT of the VCO when the drive voltage of the inverter 103 is set to 1.5 V, $V_{DATA}$ is set to 2.5 V for the circuit 104[1], $V_{DATA}$ is set to 1.8 V for the circuit 104[2], and the circuit 104[1] and the circuit 104[2] are switched.

The waveforms in FIG. 16 show that the oscillation frequency can be changed within 100 ns.

In the case where the prototype VCO is used in a PLL, power supply to component circuits other than the VCO can be stopped except in periods when infrequent refresh operations necessary to maintain the oscillation frequency are conducted. Therefore, the power consumption of the PLL in which the prototype VCO is used can be reduced.

In the case where the prototype VCO is used in the PLL, $V_{DATA}$ for outputting the previous oscillation frequency can be retained even in the case of restart from a power supply stop state. Therefore, instant restart can be achieved.

Example 2

Figure 17:
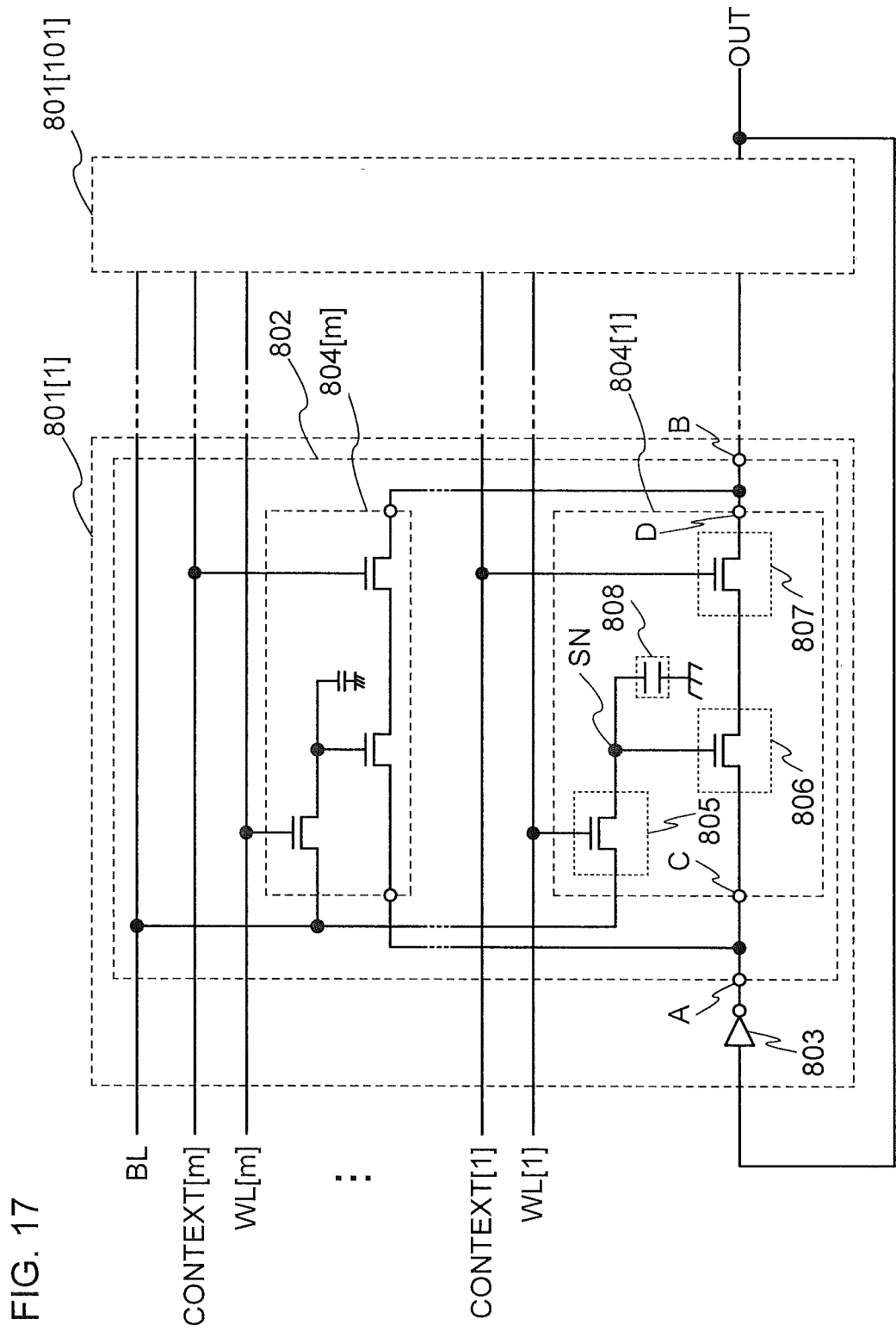
FIG. 17 illustrates a device configuration in an example.

In this example, results of evaluation of a voltage-controlled oscillator (VCO) fabricated according to one embodiment of the present invention will be described. FIG. 17 illustrates a circuit configuration of the VCO of this example. The VCO in FIG. 17 has substantially the same configuration as the device illustrated in FIG. 1 in the above embodiment which includes 101-stage circuits 101.

The VCO in FIG. 17 includes circuits 801[1] to 801[101], and the circuits 801[1] to 801[101] are connected in a ring configuration. Specifically, an output terminal of each of the circuits 801[1] to 801[100] is connected to an input terminal of the circuit of the subsequent stage. An output terminal of the circuit 801[101] is connected to an input terminal of the circuit 801[1]. The output terminal of the circuit 801[101] is connected to a terminal OUT. A signal generated by oscillation of the VCO in FIG. 17 is output from the terminal OUT.

Each of the circuits 801[1] to 801[101] includes a circuit 802 and an inverter 803. A terminal A of the circuit 802 is connected to an output terminal of the inverter 803, and a terminal B of the circuit 802 is connected to an input terminal of the inverter 803 of the subsequent stage. That is, 101 inverters 803 are connected in a ring configuration, constituting an inverter ring. The circuit 802 is connected between one inverter 803 and another. The circuit 802 is also connected to a wiring BL, wirings CONTEXT[1] to CONTEXT[m], and wirings WL[1] to WL[m]. In this example, two types of VCOs where m=2 and m=8 were fabricated.

Here, the inverter 803 is supplied with a ground potential GND as a low power supply potential and a potential $V_{RO}$ as a high power supply potential. The wiring BL is supplied with the ground potential GND as a low power supply potential and a potential $V_{DATA}$ as a high power supply potential. Note that a signal input through the wiring BL is also referred to as analog voltage data (AVD). The wirings WL[1] to WL[m] are supplied with a potential $V_{SS}$ as a low power supply potential and the potential $V_{DATA}$ as a high power supply potential. The wirings CONTEXT[1] to CONTEXT[m] are supplied with the ground potential GND as a low power supply potential and a potential $V_{CONTEXT}$ as a high power supply potential.

The circuit 802 includes circuits 804[1] to 804[m]. A terminal C of each of the circuits 804[1] to 804[m] is connected to the terminal A of the circuit 802, and a terminal D of each of the circuits 804[1] to 804[m] is connected to the terminal B of the circuit 802. Each of the circuits 804[1] to 804[m] is connected to the wiring BL, a corresponding one of the wirings CONTEXT[1] to CONTEXT[m], and a corresponding one of the wirings WL[1] to WL[m]. The corresponding one of the wirings WL[1] to WL[m] for the circuit 804[j] (j is a number from 1 to m) is the wiring WL[j]. The corresponding one of the wirings CONTEXT[1] to CONTEXT[m] for the circuit 804[j] is the wiring CONTEXT[j].

Each of the circuits 804[1] to 804[m] includes a transistor 805, a transistor 806, a transistor 807, and a capacitor 808. A first terminal of the transistor 805 is connected to the wiring BL, a second terminal of the transistor 805 is connected to a gate of the transistor 806, and a gate of the transistor 805 is connected to the corresponding one of the wirings WL[1] to WL[m]. A first terminal of the transistor 806 is connected to the terminal C. A first terminal of the transistor 807 is connected to a second terminal of the transistor 806, a second terminal of the transistor 807 is connected to the terminal D, and a gate of the transistor 807 is connected to the corresponding one of the wirings CONTEXT[1] to CONTEXT[m]. A first terminal of the capacitor 808 is connected to the gate of the transistor 806, and a second terminal of the capacitor 808 is connected to a wiring to which a predetermined potential is supplied.

The transistor 805 has a channel length of 1 μm and a channel width of 4 μm, and the transistors 806 and 807 each have a channel length of 0.5 μm and a channel width of 16 μm. In each of the transistors 806 and 807, silicon is used in a channel formation region.

In the transistor 805, a CAAC-OS film of an In—Ga—Zn oxide is used in a channel formation region. Accordingly, the off-state current of the transistor 805 is extremely small, and charge leakage from the capacitor 808 can be reduced. In addition, the transistor 805 is turned off by applying the potential $V_{SS}$ that is lower than the ground potential GND to the gate of the transistor 805, whereby the off-state current of the transistor 805 is further decreased and charge retention characteristics of the capacitor 808 are improved.

The transistor 805 includes a back gate, and the threshold voltage of the transistor 805 can be controlled by changing a voltage $V_{BG}$ for the back gate.

Note that the transistor 806 has a gate capacitance of 16 fF and a storage capacitance of 2 fF, and the combined capacitance of the gate capacitance and the storage capacitance at the node SN as a whole is 18 fF.

Figure 18:
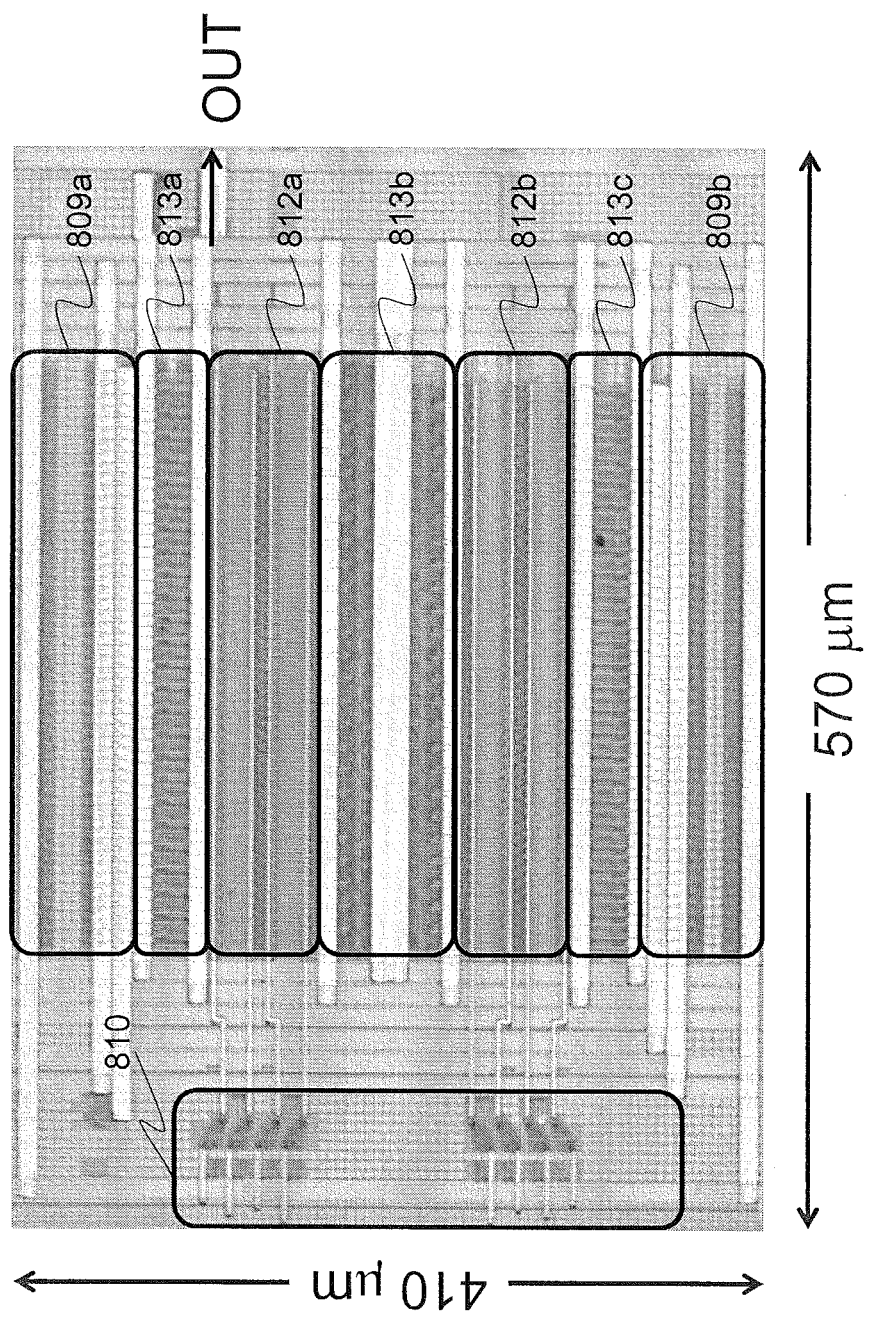
FIG. 18 is a photograph of a device in an example.
Figure 19:
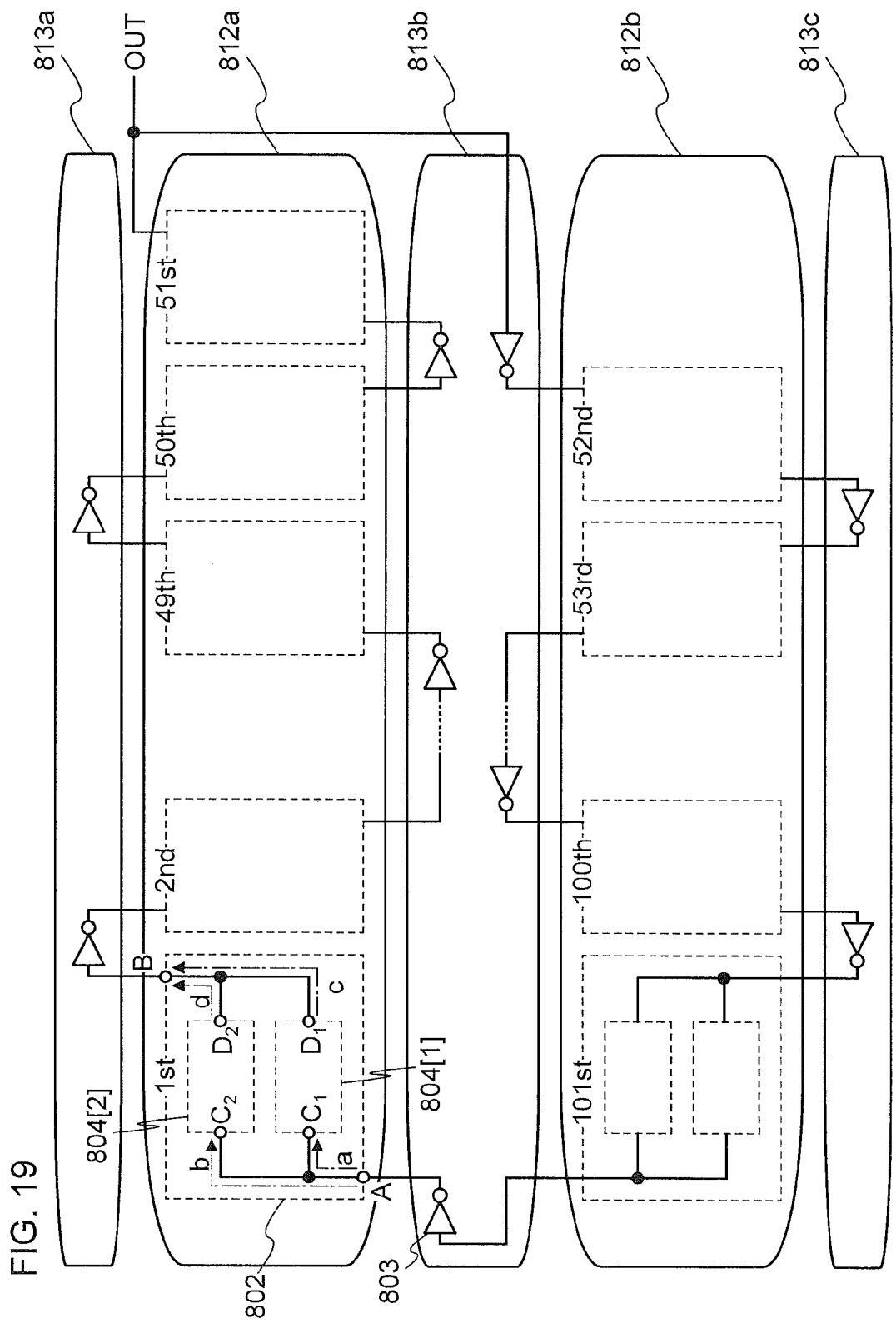
FIG. 19 is a schematic diagram illustrating a device configuration in an example.

FIG. 18 shows a photograph of a chip of the VCO where m=2. FIG. 19 shows a simplified schematic diagram of the layout of the VCO chip in FIG. 18. The VCO in FIG. 18 includes a buffer 809a, a buffer 809b, a buffer 810, a circuit 812a, a circuit 812b, an inverter 813a, an inverter 813b, and an inverter 813c. In FIG. 19, a is a wiring length between a terminal A of the circuit 802 and a terminal $C_1$ of the circuit 804[1], b is a wiring length between the terminal A of the circuit 802 and a terminal $C_2$ of the circuit 804[2], c is a wiring length between a terminal $D_1$ of the wiring 804[1] and a terminal B of the circuit 802, and d is a wiring length between a terminal $D_2$ of the wiring 804[2] and the terminal B of the circuit 802.

The buffer 809a and the buffer 809b each include the wiring BL, a buffer for supplying a potential to the wiring BL, and a peripheral wiring of the buffer. The buffer 810 includes the wirings WL[1] and WL[2], the wirings CONTEXT[1] and CONTEXT[2], a buffer for supplying a potential to these wirings, and a peripheral wiring of the buffer.

The circuit 812a includes circuits 802 of the first to 51st stages, and the circuit 812b includes circuits 802 of the 52nd to 101st stages. The inverter 813a includes an inverter 803 of a $2i_1$-th stage ($i_1$ is a natural number from 1 to 25). The inverter 813b includes an inverter 803 of a ($2i_2-1$)-th stage ($i_2$ is a natural number from 1 to 26) and an inverter 803 of a $2i_3$-th stage ($i_3$ is a natural number from 26 to 50). The inverter 813c includes an inverter 803 of a ($2i_4+1$)-th stage ($i_4$ is a natural number from 26 to 50).

As illustrated in FIG. 19, in the circuit 802 of the first stage, the terminal A is connected to an output terminal of the inverter 803 of the first stage which is included in the inverter 813b, and the terminal B is connected to an input terminal of the inverter 803 of the second stage which is included in the inverter 813a. With this configuration, wiring length a+c at the time when the circuit 804[1] is selected and wiring length b+d at the time when the circuit 804[2] is selected are substantially equal to each other. Since wiring lengths can be made substantially equal in this manner regardless of which of the circuits 804 is selected, a signal delay due to a difference in choice of the circuit 804 can be prevented.

Figure 20A:
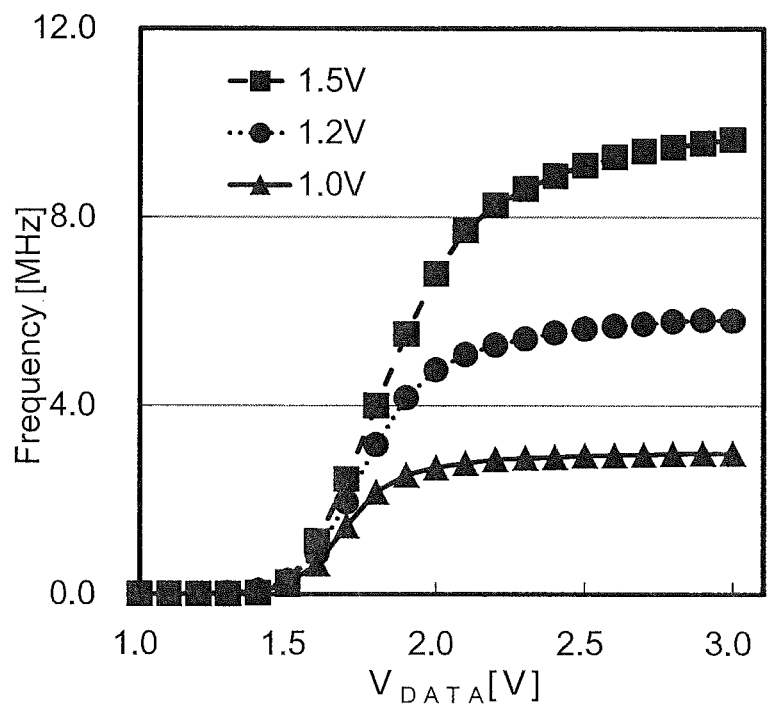
FIGS. 20A and 20B are each a graph showing a device operation.
Figure 20B:
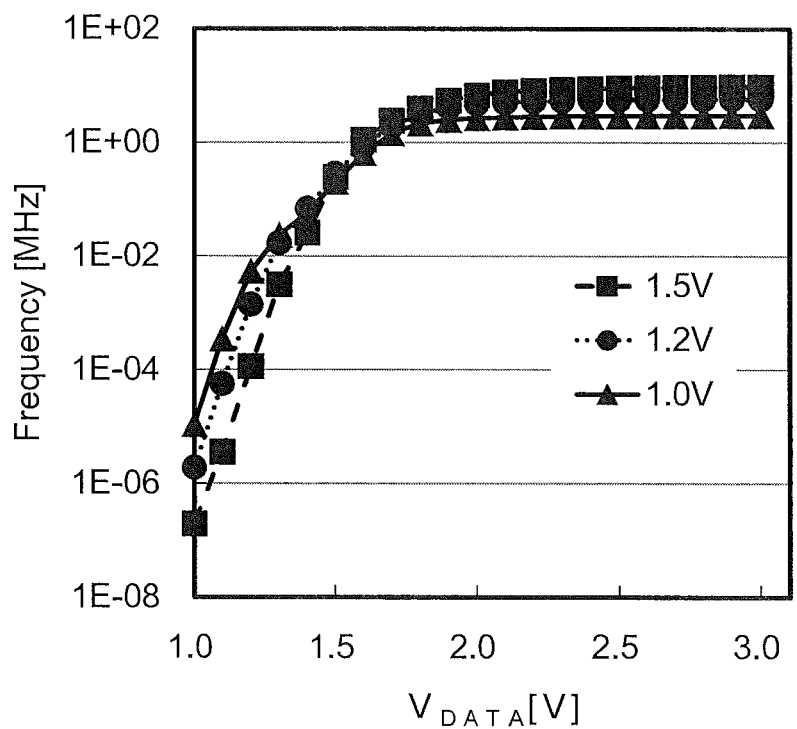

FIGS. 20A and 20B show results of measuring the oscillation frequency of an output of the VCO where m=2 with respect to the potential $V_{DATA}$ (AVD) input through the wiring BL. In FIG. 20A, the horizontal axis represents the potential $V_{DATA}$ [V], and the vertical axis represents the oscillation frequency of the output [MHz] in a linear scale. In FIG. 20B, the horizontal axis represents the potential $V_{DATA}$ [V], and the vertical axis represents the oscillation frequency of the output [MHz] in a log scale.

The oscillation frequency was measured under three conditions where the potential $V_{RO}$ was 1.0 V, 1.2 V, and 1.5 V. Here, only the circuit 804[1] was selected. As other conditions, $V_{CONTEXT}$ was 3.0 V, $V_{BG}$ was 0 V, $V_{SS}$ was −0.2 V, and write time was 1.0 ms.

FIGS. 20A and 20B show that the oscillation frequency can be controlled simply by changing the AVD. The oscillation frequency measured under the conditions where $V_{RO}$ was 1.5 V was higher than or equal to 197 mHz and lower than or equal to 9.65 MHz when the potential $V_{DATA}$ was in the range from 1.0 V to 3.0 V, which suggests that the oscillation frequency can vary over seven orders of magnitude.

Note that the change rate of the oscillation frequency varies with the change of the AVD. For example, in the case where $V_{DATA}$ is higher than or equal to 2.5 V and lower than or equal to 3.0 V, the oscillation frequency varies by 0.06 decades per 100 mV, and in the case where $V_{DATA}$ is higher than or equal to 1.0 V and lower than or equal to 1.5 V, the oscillation frequency varies by 1.24 decades per 100 mV. This is because in the case where $V_{DATA}$ is higher than or equal to 2.5 V and lower than or equal to 3.0 V, the conductivity of the transistor 806 is relatively high, the delay due to the inverter 803 is dominant, and the change in delay through the transistor 806 with the change of the AVD is small. In contrast, in the case where $V_{DATA}$ is higher than or equal to 1.0 V and lower than or equal to 1.5 V, this is because the conductivity of the transistor 806 is relatively low, the delay due to the transistor 806 is dominant, and the oscillation frequency is more dependent on the AVD.

In a range where the AVD is high, delay due to the inverter 803 is dominant, and thus, varying the potential $V_{RO}$ induces a large variation in the oscillation frequency. In the case where $V_{DATA}$ is higher than or equal to 1.0 V and lower than or equal to 1.5 V, the oscillation frequency increases at an average rate of 0.82 decades per 100 mV, 1.10 decades per 100 mV, and 1.24 decades per 100 mV when $V_{RO}$ is 1.0 V, 1.2 V, and 1.5 V, respectively. Therefore, in one example, the drive voltage of the inverter 803 is set high for the use in which a wide range of frequencies is required, and the drive voltage of the inverter 803 is set low for the use in which delicate frequency control is required.

Figure 21:
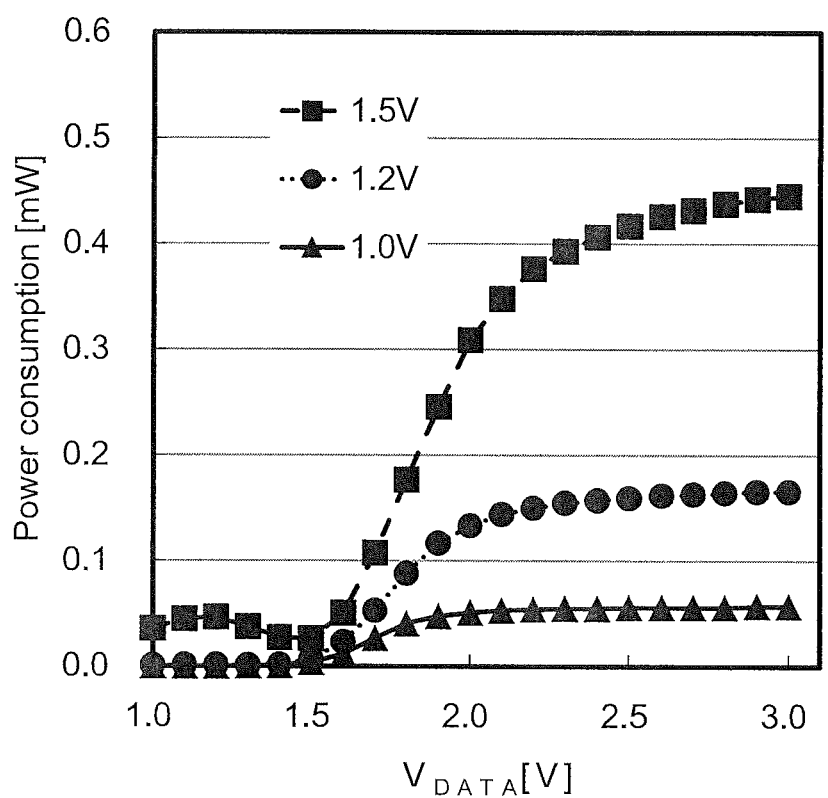
FIG. 21 is a graph showing a device operation.

FIG. 21 shows the power consumption at the points shown in FIGS. 20A and 20B. In FIG. 21, the horizontal axis represents the potential $V_{DATA}$ [V], and the vertical axis represents the power consumption [mW].

It can be seen that the dependence of the power consumption on $V_{RO}$ and $V_{DATA}$ under each condition correlates with the dependence of the oscillation frequency on $V_{RO}$ and $V_{DATA}$ which is shown in FIG. 20A. Therefore, setting $V_{RO}$ and $V_{DATA}$ by considering the intended oscillation frequency and power consumption is effective. When $V_{DATA}$ is relatively low with respect to $V_{RO}$, there is a region where power efficiency is low because the voltage drops across the circuit 804 and an intermediate potential is applied to the inverter of the subsequent stage.

Figure 22:
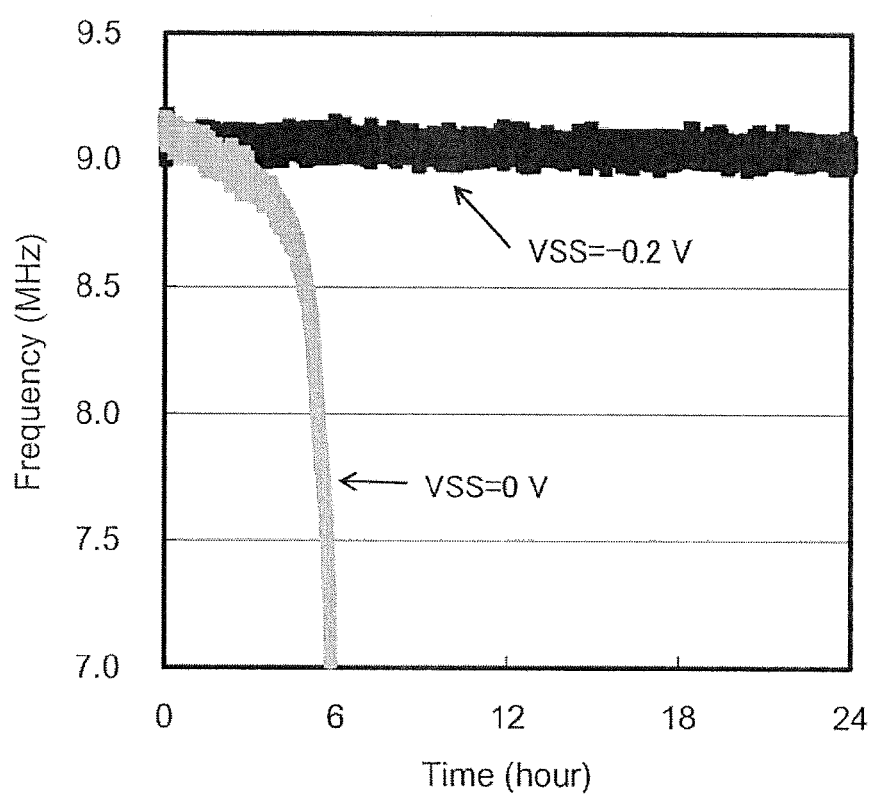
FIG. 22 is a graph showing a device operation.

FIG. 22 shows changes in the oscillation frequency over time in the case where a $V_{DATA}$ of 2.5 V is stored in the circuit 804[1] and the VCO oscillates at a $V_{RO}$ of 1.5 V. In FIG. 22, the horizontal axis represents the elapsed time [hour], and the vertical axis represents the oscillation frequency [MHz].

FIG. 22 shows results of measurement under two conditions where $V_{SS}$ was 0 V and −0.2 V. In an initial state, the oscillation frequency was 9.10 MHz under each condition. However, under the condition where $V_{SS}$ was 0 V, the oscillation frequency was attenuated over time. In 5 hours, the oscillation frequency was decreased by approximately 7.7%, and after that, the oscillation frequency was decreased at a drastic rate.

In contrast, under the condition where $V_{SS}$ was −0.2 V, the oscillation frequency was hardly decreased over time. Even after 24 hours, the oscillation frequency was 9.02 MHz and was decreased by only 0.87%. In the case where $V_{DATA}$ was uniformly decreased, the attenuation of $V_{DATA}$ over 24 hours can be estimated to be approximately 30 mV according to the graph in FIG. 20A.

Leakage current $I_{leak}$ is given by the following formula (1), where t is time (s), C is the storage capacitance (F), and $\Delta V$ is the change in voltage (V).

[Formula 1]

$$I_{leak} = \frac{\Delta V C}{t} \quad (1)$$

Since t=86400 (s), C=18 (fF), and $\Delta V$=0.03 V, leakage current $I_{leak}$ can be estimated to be $6\times10^{-21}$ (A) according to the formula (1). This indicates that the AVD can be retained for a long time by conducting quite infrequent refresh operations. Subsequent evaluations were conducted under conditions where the attenuation of the oscillation frequency over 24 hours was less than 1%, i.e., $V_{SS}$=−0.2 V.

Figure 23A:
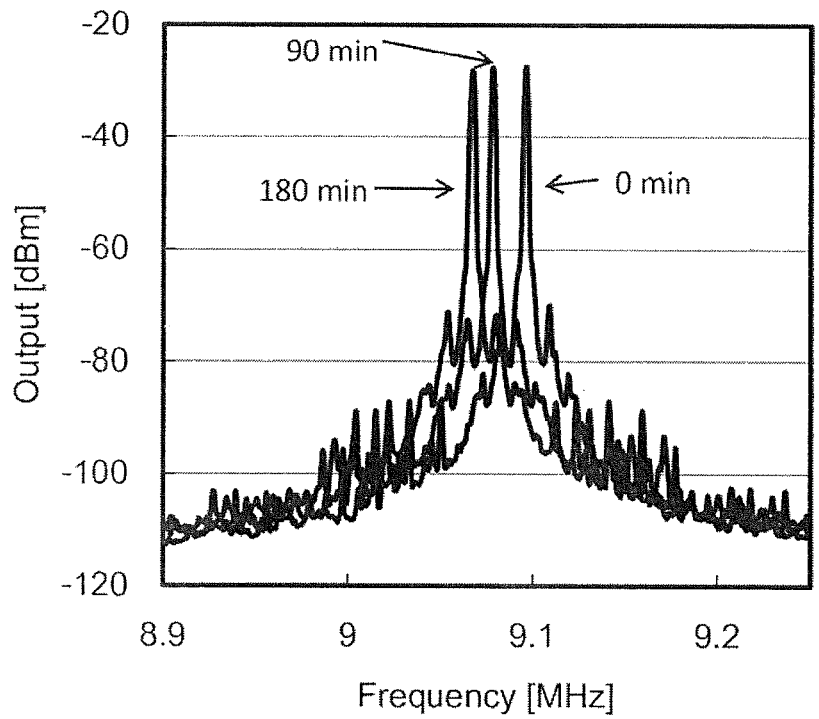
FIGS. 23A and 23B are each a graph showing a device operation.
Figure 23B:
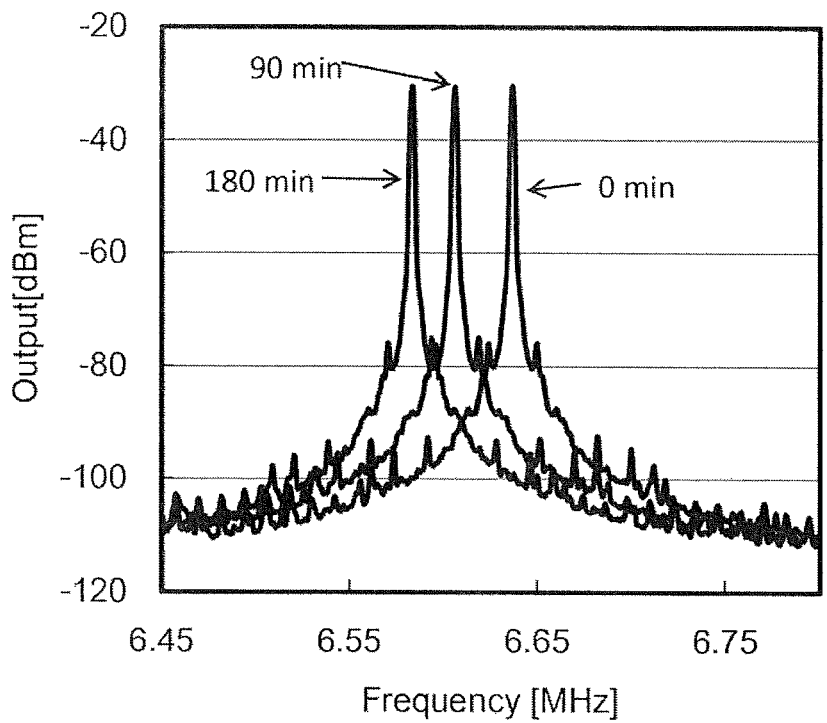

FIGS. 23A and 23B show changes in the oscillation frequency spectra of the VCO oscillating at $V_{RO}$=1.5 V. In each of FIGS. 23A and 23B, the horizontal axis represents the oscillation frequency [MHz], and the vertical axis represents the output [dBm].

FIG. 23A is a graph obtained when the AVD is set to 2.5 V. Three spectra shown in FIG. 23A are obtained at 0 min shortly after $V_{DATA}$ is applied to the node SN through the wiring BL, after 90 min, and after 180 min, respectively.

FIG. 23B is a graph obtained when the AVD is set to 2.0 V. Three spectra shown in FIG. 23B are obtained at 0 min shortly after $V_{DATA}$ is applied to the node SN through the wiring BL, after 90 min, and after 180 min, respectively.

The frequency spectrum at AVD=2.5 V in FIG. 23A peaks at 9.10 MHz at 0 min and at 9.07 MHz after 180 min, indicating a 0.34% attenuation of the oscillation frequency. The frequency spectrum at AVD=2.0 V in FIG. 23B peaks at 6.63 MHz at 0 min and at 6.58 MHz after 180 min, indicating a 0.74% attenuation of the oscillation frequency.

These results demonstrate that under the condition where $V_{SS}$ is −0.2 V, the change in the oscillation frequency is significantly small regardless of the AVD; that is, AVD data retention characteristics are significantly favorable.

Furthermore, a figure of merit (FOM) at t=0 min with the AVD set to 2.5 V was calculated from the spectra in FIG. 23A according to a formula (2).

[Formula 2]

$$FOM = Phn - 20\log\left(\frac{F_c}{\Delta F}\right) + 10\log(1000P) \quad (2)$$

Here, Phn is the phase noise, $F_c$ is the center frequency, and P is the power consumption.

Table 1 shows the FOM of this example and those of comparative examples 1 and 2 which are ring-oscillatorbased VCOs. Note that Reference 1 (S. B. Anand and B. Razavi, "A CMOS Clock Recovery Circuit for 2.5-Gb/s NRZ Data," IEEE. J. Solid-State Circuits, vol. 36, no. 3, pp. 432-439, March 2001) can be referred to for the comparative example 1, and Reference 2 (C. Zhai et al., "An N-path Filter Enhanced Low Phase Noise Ring VCO," in Proc. VLSI Circuits Symp., 2014, pp. 187-188) can be referred to for the comparative example 2.

TABLE 1

|  | Example 2 | Comparative example 1 | Comparative example 2 |
|---|---|---|---|
| $F_c$ | 9.1 MHz | 2.5 GHz | 1.0 GHz |
| Phase noise (dBc/Hz) | −108.8 | −80.0 | −110.0 |
| Power | 420 μW | 10.0 mW | 4.7 mW |
| FOM (dBc/Hz) | −151.8 | −124.0 | −163.3 |

As shown in Table 1, the VCO of this example has comparable or higher performance in comparison with the FOMs of the other ring-oscillator-based VCOs.

Figure 24A:
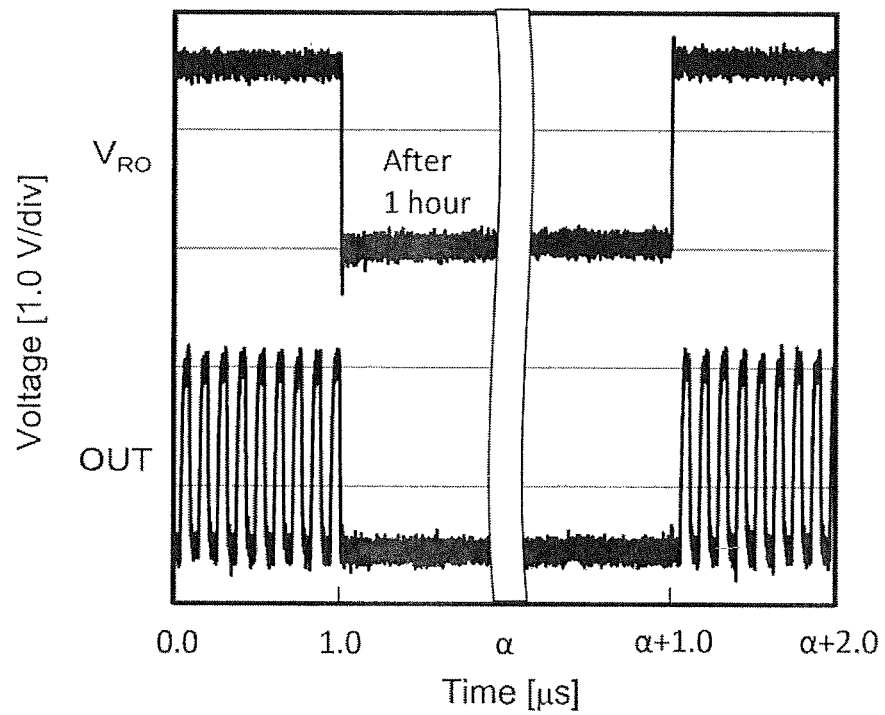
FIGS. 24A and 24B are each a graph showing a device operation.
Figure 24B:
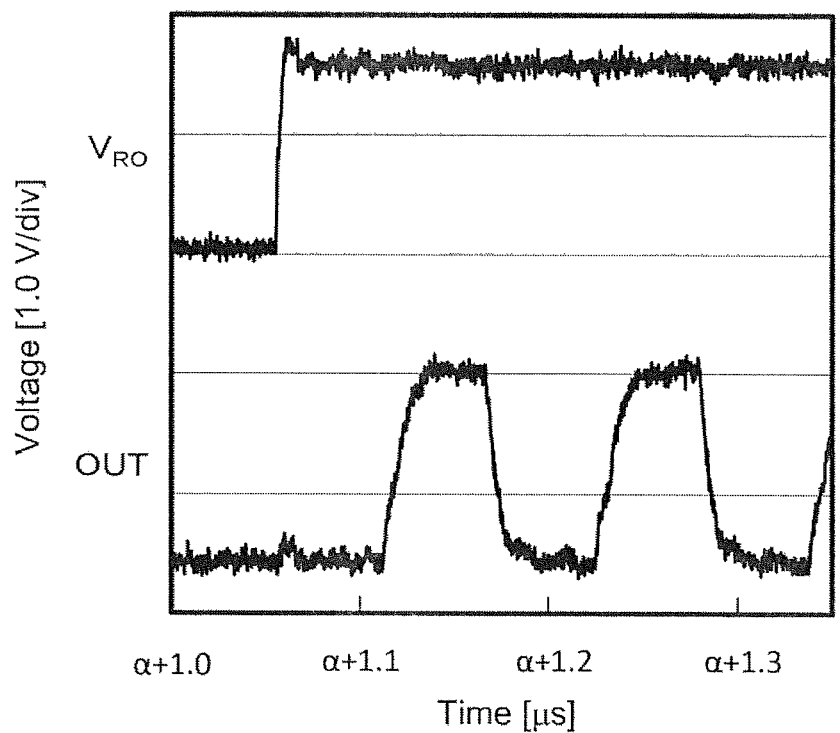

The VCO of this example can retain an analog potential at the node SN and can maintain the oscillation frequency also at the time of restart after the stop of power supply. FIGS. 24A and 24B show waveforms obtained at the terminal OUT at the time of restart from a power supply stop state in the case where $V_{DATA}$ is 2.5 V, for example. Here, evaluation was conducted under conditions where $V_{RO}$=1.5 V, $V_{SS}$=−0.2 V, and $V_{BG}$=0 V. Note that FIG. 24B shows an enlarged portion of FIG. 24A at around the time of restart.

The waveforms is in FIGS. 24A and 24B show that oscillation is resumed within 100 ns by restart from the power supply stop state at time (α+1.0) μs. Note that α is 1 hour in FIG. 24A. That is, FIGS. 24A and 24B show that oscillation is favorably resumed even after 1 hour.

Accordingly, in the case where the VCO of this example is used in a PLL, power supply to component circuits other than the VCO can be stopped except in periods when infrequent refresh operations necessary to maintain the oscillation frequency are conducted. Therefore, the power consumption of the PLL in which the VCO of this example is used can be reduced.

In the case where the VCO of this example is used in the PLL, $V_{DATA}$ for outputting the previous oscillation frequency can be retained even in the case of restart from a power supply stop state. Therefore, instant restart can be achieved.

Figure 25:
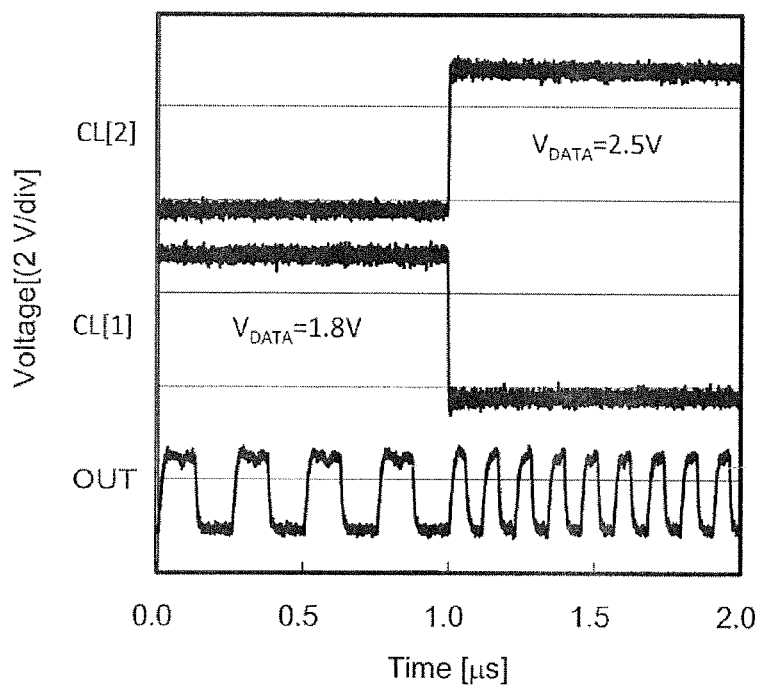
FIG. 25 is a graph showing a device operation.

The VCO of this example can change the oscillation frequency in a short time when different analog potentials of $V_{DATA}$ are set for the circuits 804[1] to 804[m] and the circuits 804[1] to 804[m] to be selected are switched. FIG. 25 shows waveforms obtained at the terminal OUT of the VCO when $V_{RO}$ is set to 1.5 V, $V_{DATA}$ is set to 1.8 V for the circuit 804[1], $V_{DATA}$ is set to 2.5 V for the circuit 804[2], and the circuit 804[1] and the circuit 804[2] are switched.

In FIG. 25, in a period when time t is longer than or equal to 0 μs and shorter than 1.0 μs, the circuit 804[1] is selected, and a signal with an oscillation frequency of 4.0 MHz is output in accordance with an AVD of 1.8 V. At t=1.0 μs, by changing the selected circuit to the circuit 804[2], the oscillation frequency of the output signal instantaneously changes to 9.1 MHz.

As described above, the waveforms in FIG. 25 show that the VCO of this example can change the oscillation frequency within 100 ns.

Figure 26:
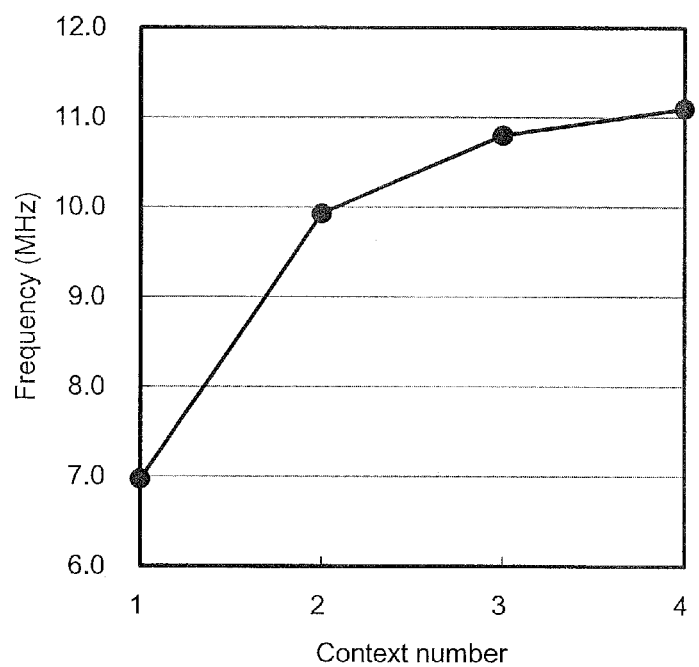
FIG. 26 is a graph showing a device operation.

Next, the oscillation frequency of the VCO where m=8 was measured with $V_{DATA}$ set to 2.5 V for the circuits 804[1] to 804[8] and with the number of selected circuits 804 varied from 1 to 4. Here, the measurement was conducted under conditions where $V_{RO}$=3.0 V, $V_{SS}$=−0.2 V, and $V_{BG}$=0 V. FIG. 26 is a graph showing the relationship between the number of selected circuits 804 and the oscillation frequency.

The oscillation frequency is 6.97 MHz when one circuit 804 is selected, but increases to 9.93 MHz, 10.80 MHz, and 11.10 MHz as the number of selected circuits 804 increases to 2, 3, and 4, respectively. This is because increasing the number of selected circuits 804 increases the conductivity of the circuit 802 and reduces delay. That is, the oscillation frequency can be controlled by specifying the number of selected circuits 804.

Note that delay time in inverters exerts a greater effect on the oscillation frequency of the VCO when more circuits 804 are selected, because the conductivity increases. Therefore, when a larger number of circuits 804 are selected, the increase rate of the oscillation frequency of the VCO with respect to the increase in the number of selected circuits 804 decreases.

A VCO containing a plurality of analog memory sets can store different AVD sets in the circuits 804. Therefore, a wide oscillation frequency range can be minutely controlled by combining digital control (for changing the number of selected circuits 804) with analog control (for changing the AVD value).

EXPLANATION OF REFERENCE

10: semiconductor device, 21: circuit, 22: transistor, 23: transistor, 90: transistor, 91: insulating film, 92a: oxide semiconductor film, 92b: oxide semiconductor film, 92c: oxide semiconductor film, 93: conductive film, 94: conductive film, 95: insulating film, 96: conductive film, 97: substrate, 101: circuit, 102: circuit, 103: inverter, 103A: NAND circuit, 104: circuit, 105: transistor, 106: transistor, 107: transistor, 108: capacitor, 201: phase comparator, 202: loop filter, 203: voltage-controlled oscillator, 204: frequency divider, 400: substrate, 401: element isolation region, 402: impurity region, 403: impurity region, 404: channel formation region, 405: insulating film, 406: gate electrode, 411: insulating film, 412: conductive film, 413: conductive film, 414: conductive film, 416: conductive film, 417: conductive film, 418: conductive film, 420: insulating film, 421: insulating film, 422: insulating film, 430: semiconductor film, 430a: oxide semiconductor film, 430c: oxide semiconductor film, 431: gate insulating film, 432: conductive film, 433: conductive film, 434: gate electrode, 601: semiconductor substrate, 610: element isolation region, 611: insulating film, 612: insulating film, 613: insulating film, 625: conductive film, 626: conductive film, 627: conductive film, 634: conductive film, 635: conductive film, 636: conductive film, 637: conductive film, 644: conductive film, 651: conductive film, 652: conductive film, 653: conductive film, 661: insulating film, 662: gate insulating film, 663: insulating film, 701: semiconductor film, 710: region, 711: region, 721: conductive film, 722: conductive film, 731: gate electrode, 801: circuit, 802: circuit, 803: inverter, 804: circuit, 805: transistor, 806: transistor, 807: transistor, 808: capacitor, 809a: buffer, 809b: buffer, 810: buffer, 812a: circuit, 812b: circuit, 813a: inverter, 813b: inverter, 813c: inverter, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, and 5806: joint.

This application is based on Japanese Patent Application serial No. 2014-044522 filed with Japan Patent Office on Mar. 7, 2014, Japanese Patent Application serial No. 2014-044532 filed with Japan Patent Office on Mar. 7, 2014, Japanese Patent Application serial No. 2014-091047 filed with Japan Patent Office on Apr. 25, 2014, and Japanese Patent Application serial No. 2014-180900 filed with Japan Patent Office on Sep. 5, 2014, the entire contents of which are hereby incorporated by reference.

The invention claimed is:

1. A semiconductor device comprising:
an oscillator circuit, the oscillator circuit comprising first to n-th inverters (n is an odd number greater than or equal to 3), a first circuit, and a second circuit;
a frequency divider having an input electrically connected to an output of the oscillator circuit;
a phase comparator having an input electrically connected to an output of the frequency divider;
a loop filter having an input electrically connected to an output of the phase comparator, and an output electrically connected to an input of the oscillator circuit,
wherein a first terminal of the first circuit is electrically connected to an output terminal of the i-th inverter (i is a number from 1 to (n−1)),
wherein a second terminal of the first circuit is electrically connected to an input terminal of the (i+1)-th inverter,
wherein a first terminal of the second circuit is electrically connected to the output terminal of the i-th inverter,
wherein a second terminal of the second circuit is electrically connected to the input terminal of the (i+1)-th inverter,
wherein the first circuit has a function of storing first data,
wherein the first circuit has a function of switching between electrically disconnecting the first terminal and the second terminal from each other and setting a resistance between the first terminal and the second terminal to a value based on the first data,
wherein the second circuit has a function of storing second data, and
wherein the second circuit has a function of switching between electrically disconnecting the first terminal and the second terminal from each other and setting a resistance between the first terminal and the second terminal to a value based on the second data.

2. The semiconductor device according to claim 1, wherein the first data and the second data are analog potentials.

3. The semiconductor device according to claim 1,
wherein the first circuit includes a first transistor and a first capacitor,
wherein the second circuit includes a second transistor and a second capacitor,
wherein the first transistor includes an oxide semiconductor in a channel formation region,
wherein the second transistor includes an oxide semiconductor in a channel formation region,
wherein the first data is input to the first capacitor through the first transistor, and
wherein the second data is input to the second capacitor through the second transistor.

4. A semiconductor device comprising:
an oscillator circuit, the oscillator circuit comprising first to n-th inverters (n is an odd number greater than or equal to 3), a first circuit, and a second circuit;
a frequency divider having an input electrically connected to an output of the oscillator circuit;
a phase comparator having an input electrically connected to an output of the frequency divider;
a low-pass filter having an input electrically connected to an output of the phase comparator, and an output electrically connected to an input of the oscillator circuit,
wherein a first terminal of the first circuit is electrically connected to an output terminal of the i-th inverter (i is a number from 1 to (n−1)),
wherein a second terminal of the first circuit is electrically connected to an input terminal of the (i+1)-th inverter,
wherein a first terminal of the second circuit is electrically connected to the output terminal of the i-th inverter,
wherein a second terminal of the second circuit is electrically connected to the input terminal of the (i+1)-th inverter,
wherein the first circuit has a function of storing first data,
wherein the first circuit has a function of switching between electrically disconnecting the first terminal and the second terminal from each other and setting a resistance between the first terminal and the second terminal to a value based on the first data,
wherein the second circuit has a function of storing second data, and
wherein the second circuit has a function of switching between electrically disconnecting the first terminal and the second terminal from each other and setting a resistance between the first terminal and the second terminal to a value based on the second data.

5. The semiconductor device according to claim 4, wherein the first data and the second data are analog potentials.

6. The semiconductor device according to claim 4,
wherein the first circuit includes a first transistor and a first capacitor,
wherein the second circuit includes a second transistor and a second capacitor,
wherein the first transistor includes an oxide semiconductor in a channel formation region,
wherein the second transistor includes an oxide semiconductor in a channel formation region,
wherein the first data is input to the first capacitor through the first transistor, and
wherein the second data is input to the second capacitor through the second transistor.

7. A semiconductor device comprising:
an oscillator circuit, the oscillator circuit comprising:
an inverter; and
a first circuit comprising a first terminal and a second terminal;
wherein the first terminal of the first circuit is electrically connected to an output terminal of the inverter,
wherein the first circuit has a function of storing first data, and
wherein the first circuit has a function of switching between electrically disconnecting the first terminal and the second terminal from each other and setting a resistance between the first terminal and the second terminal to a value based on the first data.

* * * * *